(12) United States Patent
Kim

(10) Patent No.: US 12,495,613 B2
(45) Date of Patent: Dec. 9, 2025

(54) DISPLAY DEVICE

(71) Applicant: Samsung Display Co., LTD., Yongin-si (KR)

(72) Inventor: Byoung Yong Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 353 days.

(21) Appl. No.: 18/083,731

(22) Filed: Dec. 19, 2022

(65) Prior Publication Data

US 2023/0207577 A1 Jun. 29, 2023

(30) Foreign Application Priority Data

Dec. 28, 2021 (KR) .......................... 10-2021-0189127

(51) Int. Cl.
*H10D 86/60* (2025.01)
*H10D 86/40* (2025.01)

(52) U.S. Cl.
CPC .......... *H10D 86/60* (2025.01); *H10D 86/443* (2025.01); *H10D 86/411* (2025.01)

(58) Field of Classification Search
CPC .. H05K 1/117; H05K 59/82; H05K 59/80515; H05K 59/80521; H05K 59/80; H05K 59/131; H05K 59/1315; H10H 29/49; H10H 29/857; H10H 29/0364; H10D 86/60; H10D 86/441; H10K 59/131; H10K 1/117
See application file for complete search history.

(56) References Cited

U.S. PATENT DOCUMENTS

| | | | |
|---|---|---|---|
| 8,679,674 B2 | 3/2014 | Liang et al. | |
| 8,946,547 B2 | 2/2015 | Moslehi et al. | |
| 11,696,474 B2 | 7/2023 | Lim et al. | |
| 12,278,244 B2 * | 4/2025 | Gong | H10D 86/60 |
| 2023/0207733 A1 * | 6/2023 | Gong | H10H 20/01 257/79 |
| 2023/0301150 A1 | 9/2023 | Lim et al. | |

FOREIGN PATENT DOCUMENTS

| | | |
|---|---|---|
| KR | 10-2020-0083859 | 7/2020 |
| KR | 1020200099066 A | 8/2020 |
| KR | 10-2196544 | 12/2020 |
| KR | 1020210025167 A | 3/2021 |

* cited by examiner

*Primary Examiner* — Jose R Diaz
(74) *Attorney, Agent, or Firm* — CANTOR COLBURN LLP

(57) ABSTRACT

A display device includes a substrate including a first surface, a second surface facing the first surface, and a side surface connecting the first surface and the second surface; a first side wiring disposed on the side surface of the substrate and extending in a first direction from the first surface to the second surface. The first side wiring includes a first upper part adjacent to the first surface, a first lower part adjacent to the second surface, and a first connecting part connecting between the first upper part and the first lower part. At least one of the first upper part and the first lower part has a width greater than a width of the first connecting part.

20 Claims, 20 Drawing Sheets

DISPLAY DEVICE

CROSS-REFERENCE TO RELATED APPLICATION(S)

This application claims priority to and benefits of Korean Patent Application No. 10-2021-0189127 under 35 U.S.C. § 119, filed on Dec. 28, 2021, in the Korean Intellectual Property Office, the entire contents of which are incorporated herein by reference.

BACKGROUND

1. Technical Field

Embodiments of the disclosure relate to a display device including side wirings.

2. Description of the Related Art

A display device for displaying an image has been widely used for various electronic appliances for providing an image to a user, such as smart phones, tablet personal computers (PCs), digital cameras, notebook computers, navigators, and televisions.

The display device includes a display area for implementing a variety of colors while being operated on a pixel or a sub-pixel basis and a bezel area in which wirings for driving pixels or sub-pixels are disposed.

Recently, the demand for a bezel-less technology for reducing or eliminating the bezel area so as to maximize the display area is increasing, and in response to such demand, research and development of a technology of forming side wirings have been steadily progressed.

SUMMARY

Embodiments of the disclosure provide a display device capable of preventing disconnection of side wirings of the display device.

However, embodiments of the disclosure are not restricted to those set forth herein. The above and other aspects of the disclosure will become more apparent to one of ordinary skill in the art to which the disclosure pertains by referencing the detailed description of the disclosure given below.

It should be noted that the effects of the embodiments are not limited to those described above, and other effects of the embodiments will be apparent from the following description.

According to an embodiment of the disclosure, a display device may include, a substrate including a first surface, a second surface facing the first surface, and a side surface connecting the first surface and the second surface; a first side wiring disposed on the side surface of the substrate and extending in a first direction from the first surface to the second surface, wherein the first side wiring may include a first upper part adjacent to the first surface, a first lower part adjacent to the second surface, and a first connecting part connecting between the first upper part and the first lower part, wherein at least one of the first upper part and the first lower part has a width greater than a width of the first connecting part.

In an embodiment, the width of the first upper part and the width of the first lower part may be greater than the width of the first connecting part.

In an embodiment, the first upper part may cover a boundary between the first surface and the side surface of the substrate, and the first lower part may cover a boundary between the second surface and the side surface of the substrate.

In an embodiment, the display device may further include a second side wiring extending in the first direction and disposed to be spaced apart from the first side wiring in a second direction intersecting the first direction, wherein the second side wiring may include a second upper part adjacent to the first surface, a second lower part adjacent to the second surface, and a second connecting part connecting between the second upper part and the second lower part, wherein a width of the second upper part and a width of the second lower part may be greater than a width of the second connecting part and the first side wiring and the second side wiring are repeatedly disposed in the second direction.

In an embodiment, the second upper part may cover the boundary between the first surface and the side surface of the substrate, and the second lower part may cover the boundary between the second surface and the side surface of the substrate.

In an embodiment, the width of the first upper part of the first side wiring may gradually increase as being closer to the first surface, wherein a width of a portion of the first upper part in contact with the first connecting part and the width of the first connecting part may be substantially the same as each other, and the width of the second upper part of the second side wiring may gradually increase as being closer to the first surface, wherein a width of a portion of the second upper part in contact with the second connecting part and the width of the second connecting part may be substantially the same as each other.

In an embodiment, a width of a portion of the first upper part in contact with the first connecting part may be greater than the width of the first connecting part and a width of the second upper part in contact with the second connecting part may be greater than the width of the second connecting part.

In an embodiment, the width of the first upper part of the first side wiring may gradually increase as being closer to the first surface and the width of the second upper part of the second side wiring may gradually decrease as being closer to the first direction.

In an embodiment, the display device may further include: a plurality of pixels disposed on the first surface of the substrate; and a driving portion disposed on the second surface of the substrate, wherein the first side wiring and the second side wiring may electrically connect the plurality of pixels and the driving portion.

In an embodiment, the first upper part of the first side wiring may have a width greater than the width of the first lower part and the width of the first connecting part.

In an embodiment, further including a second side wiring extending in the first direction and disposed to be spaced apart from the first side wiring in a second direction intersecting the first direction, wherein the second side wiring may include a second upper part adjacent to the first surface, a second lower part adjacent to the second surface, and a second connecting part connecting between the second upper part and the second lower part, wherein the second lower part may have a width greater than a width of the second upper part and a width of the second connecting part and the first side wiring and the second side wiring are repeatedly disposed in the second direction.

In an embodiment, the width of the first connecting part and the width of the first lower part may be substantially same as each other, and the width of the second connecting part and the width of the second lower part may be substantially same as each other.

In an embodiment, further including a second side wiring extending in the first direction and disposed to be spaced apart from the first side wiring in a second direction intersecting the first direction, wherein the second side wiring may have a width that is substantially constant along the first direction and the first side wiring and the second side wiring are repeatedly disposed.

According to an embodiment, a display device may include, a substrate including a main body portion including a first surface and a second surface facing the first surface, and an edge portion connecting the first surface and the second surface of the main body portion; and a plurality of side wirings disposed on the edge portion and spaced apart from each other, wherein the edge portion of the substrate may include a first flat surface in contact with the first surface and parallel to the first surface, a first chamfered surface inclined with respect to the first flat surface and in contact with the first flat surface, and a second flat surface inclined with respect to the first chamfered surface and in contact with the first chamfered surface, each of the plurality of side wirings may include an upper part adjacent to the first surface, a lower part adjacent to the second surface, and a connecting part connecting the upper part and the lower part and having a width smaller than a width of the upper part, and the upper part of each of the plurality of side wirings may cover the first flat surface, the first chamfered surface, and the second flat surface.

In an embodiment, the first flat surface and the first chamfered surface of the edge portion may be in contact with each other to form a first_first edge as a boundary between the first flat surface and the first chamfered surface, the first chamfered surface and the second flat surface may be in contact with each other to form a first_second edge as a boundary between the first chamfered surface and the second flat surface, and the upper part may cover the first_first edge and the first_second edge.

In an embodiment, the edge portion may further include a third flat surface in contact with the second surface and parallel to the second surface, and a second chamfered surface inclined with respect to the third flat surface and in contact with the third flat surface and the second flat surface, and the lower part may have a width greater than a width of the connecting part and covers the second flat surface, the second chamfered surface, and the third flat surface.

In an embodiment, the display device may further include: a plurality of pixels disposed on the first surface of the main body portion; a driving portion disposed on the second surface of the main body portion; and a plurality of pads disposed on the first flat surface and the third flat surface, wherein the plurality of pads may electrically connect the plurality of pixels and the plurality of side wirings on the first flat surface and electrically connect the plurality of side wirings and the driving portion on the third flat surface.

According to an embodiment, a display device may include, a substrate including a first surface, a second surface facing the first surface, and a side surface connecting the first surface and the second surface; and a first side wiring and a second side wiring disposed on the side surface of the substrate, extending in a first direction from the first surface to the second surface, and spaced apart from each other in a second direction intersecting the first direction, wherein the first side wiring may include a first upper part adjacent to the first surface, a first lower part adjacent to the second surface, and a first connecting part connecting between the first upper part and the first lower part, the second side wiring may include a second upper part adjacent to the first surface, a second lower part adjacent to the second surface, and a second connecting part connecting between the second upper part and the second lower part, and a distance between the first upper part and the second upper part in the second direction may be smaller than a distance between the first connecting part and the second connecting part in the second direction.

In an embodiment, a distance between the first lower part and the second lower part in the second direction may be smaller than the distance between the first connecting part and the second connecting part in the second direction.

In an embodiment, a width of the first upper part may gradually decrease as being closer to the first connecting part, a width of the second upper part may gradually increase as being closer to the second connecting part, and the distance between the first upper part and the second upper part is substantially constant along the first direction.

BRIEF DESCRIPTION OF THE DRAWINGS

The above and other aspects and features of the disclosure will become more apparent by describing in detail embodiments thereof with reference to the attached drawings.

DETAILED DESCRIPTION OF THE EMBODIMENTS

Figure 1:
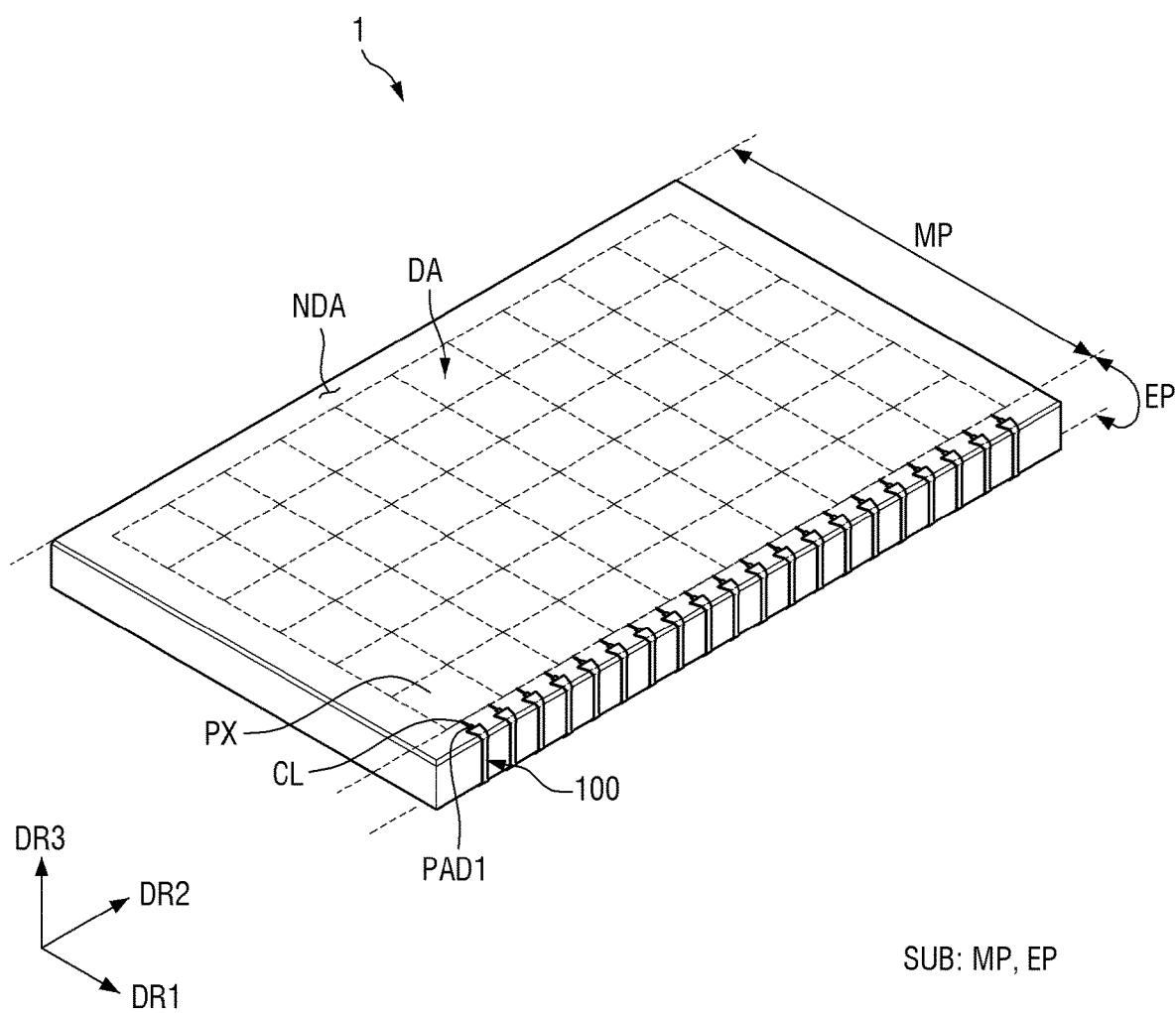
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments of the disclosure will be described with reference to the attached drawings.

Figure 2:
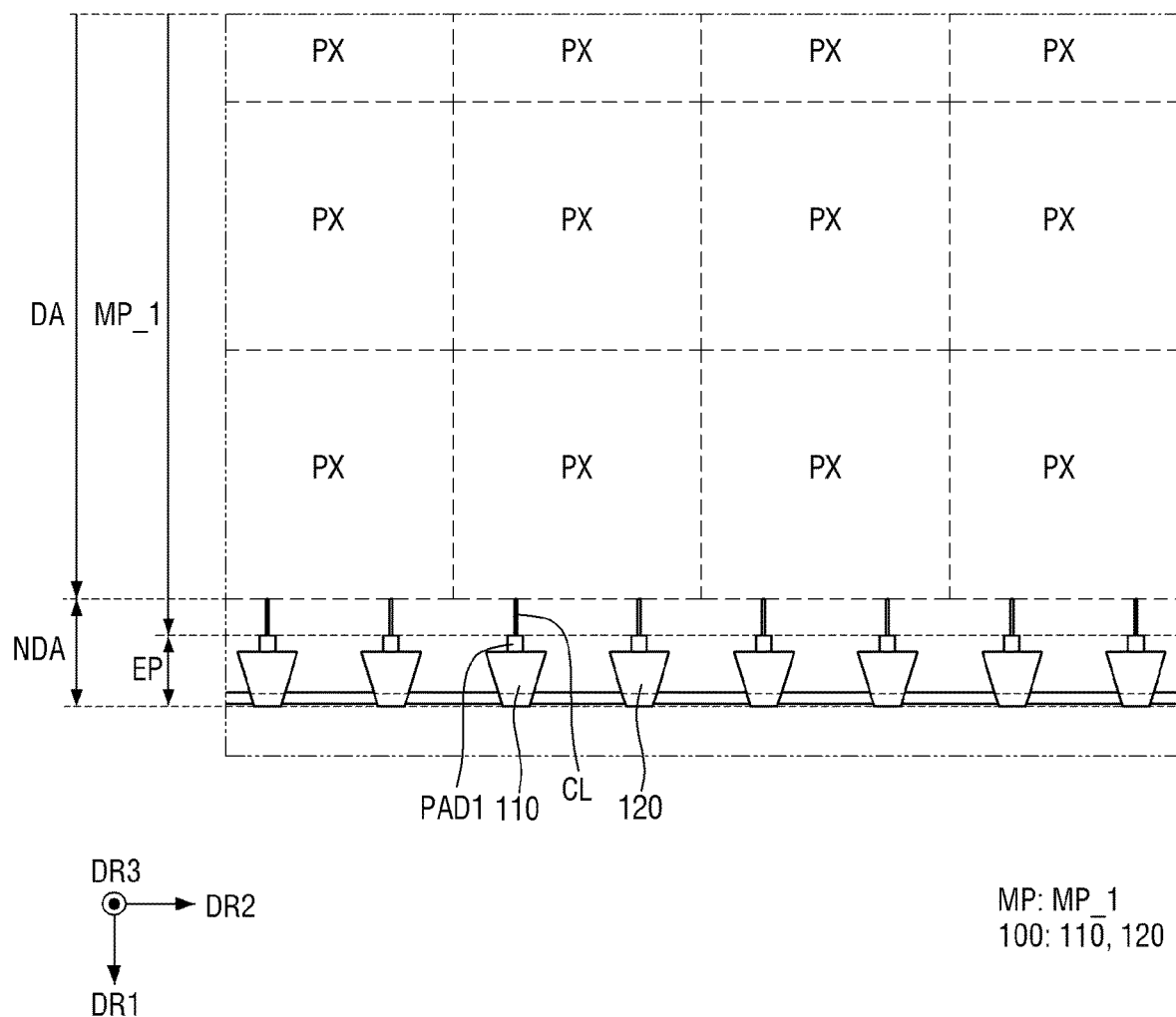
FIG. 2 is a schematic plan view of a first surface of a main body portion of a substrate.
Figure 3:
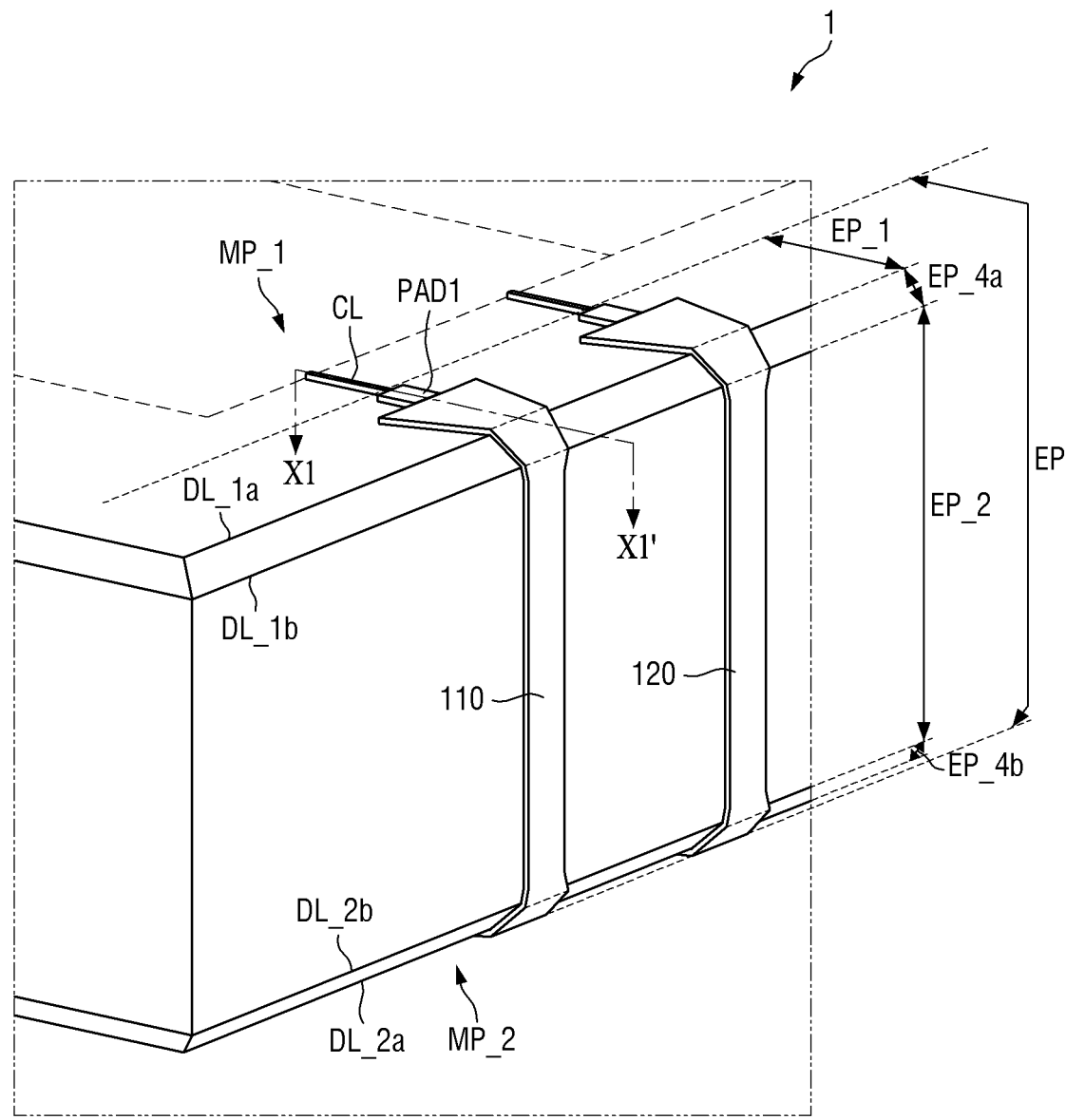
FIG. 3 is a schematic perspective view illustrating shapes of side wirings disposed on an edge portion of a substrate.
Figure 4:
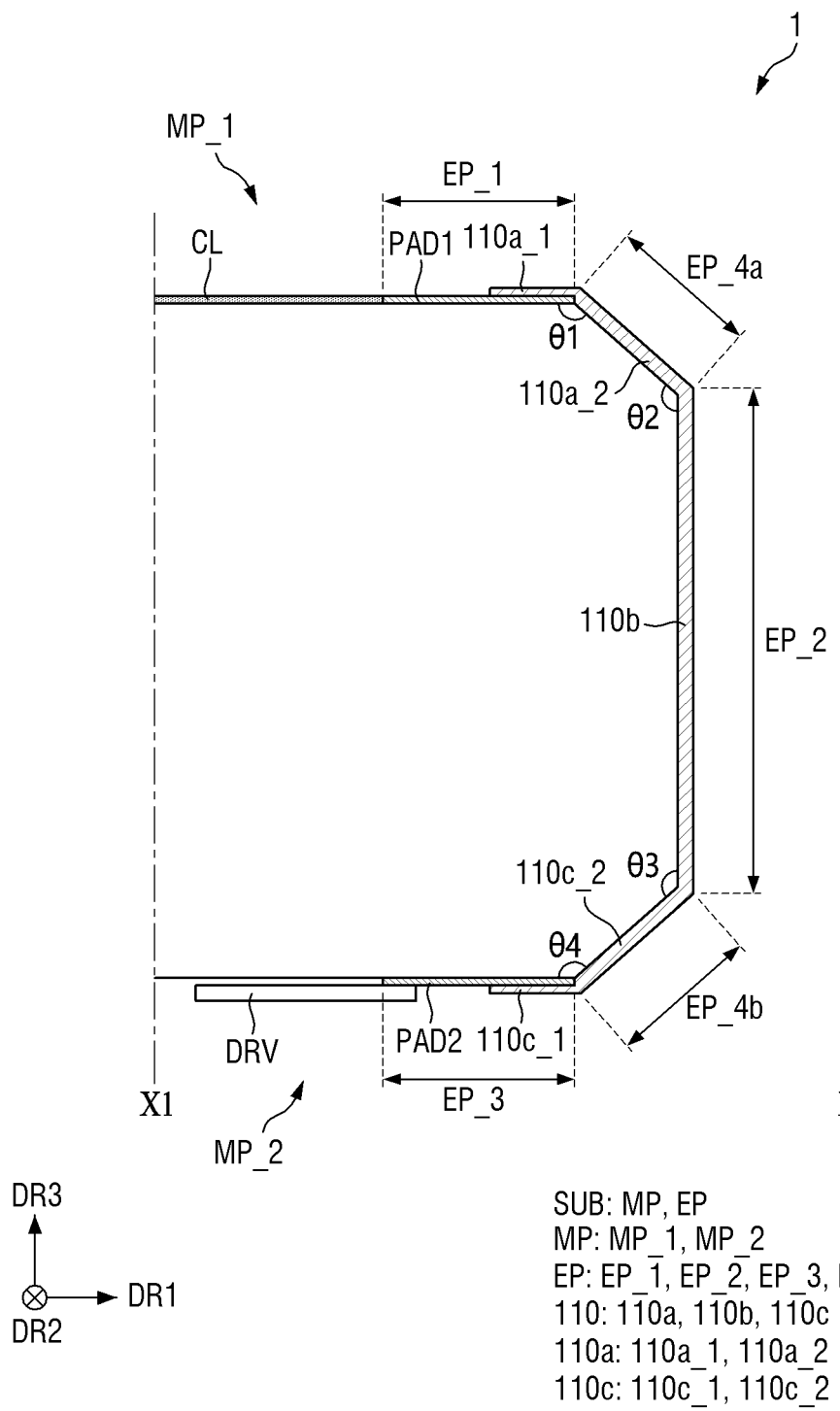
FIG. 4 is a schematic cross-sectional view taken along line X1-X1' of FIG. 3.
Figure 5:
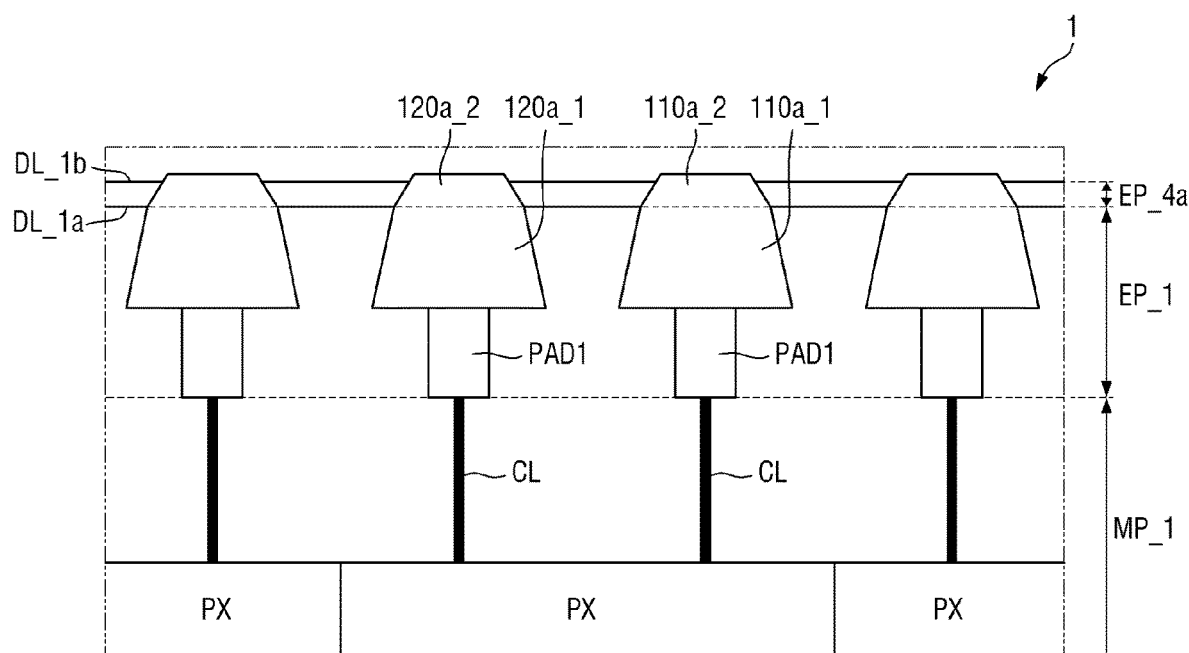
FIG. 5 is a schematic plan view illustrating a first flat surface of a substrate edge portion and a portion of a first surface of a main body portion.
Figure 6:
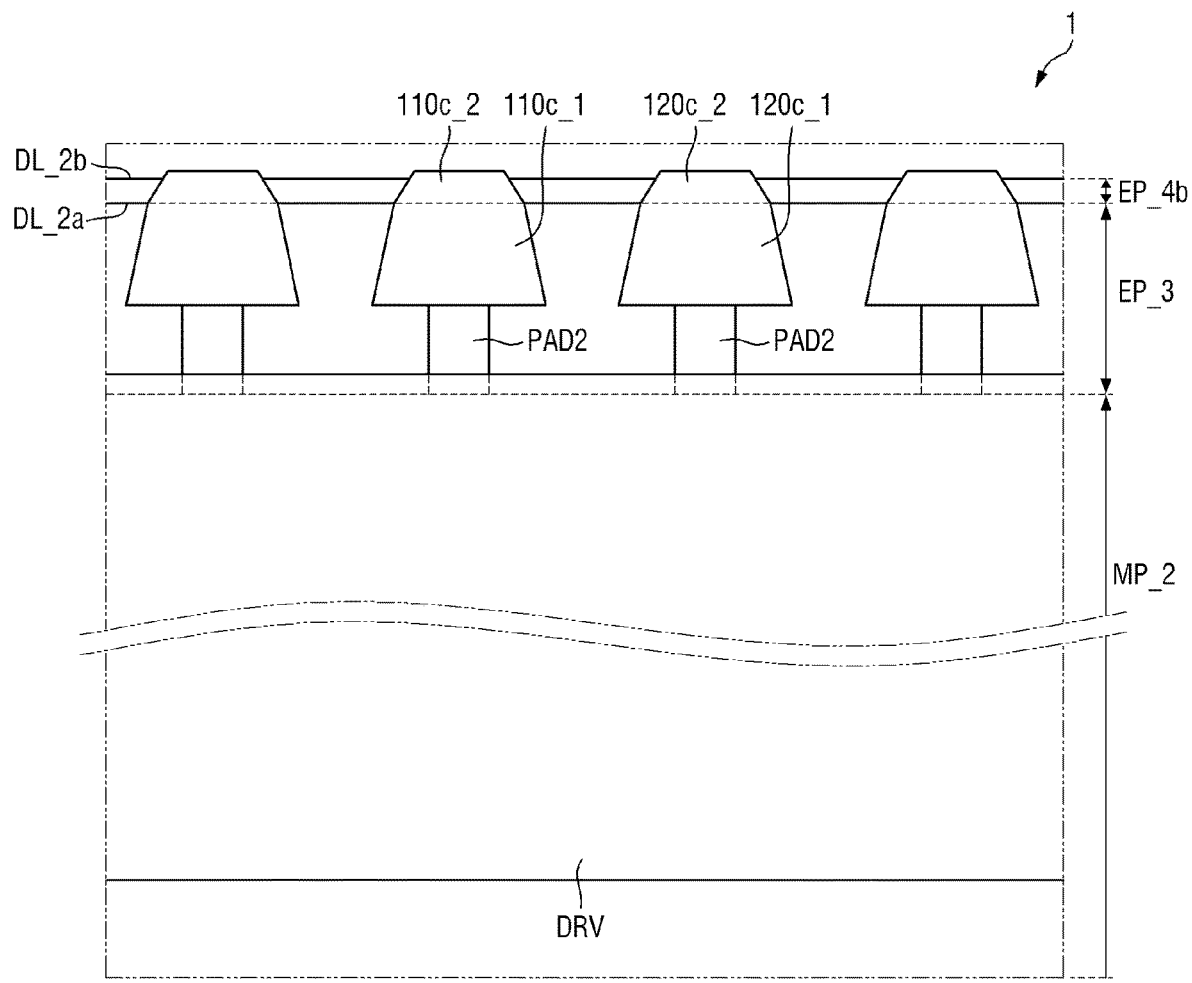
FIG. 6 is a schematic plan view illustrating a third flat surface of the substrate edge portion and a portion of a second surface of the main body portion.

FIG. 1 is a schematic perspective view of a display device according to an embodiment. FIG. 2 is a schematic plan view of a first surface of a main body portion of a substrate. FIG. 3 is a schematic perspective view illustrating shapes of side wirings disposed on a substrate edge portion. FIG. 4 is a schematic cross-sectional view taken along line X1-X1' of FIG. 3. FIG. 5 is a schematic plan view illustrating a first flat surface of a substrate edge portion and a portion of a first surface of a main body portion. FIG. 6 is a schematic plan view illustrating a third flat surface of the substrate edge portion and a portion of a second surface of the main body portion.

Referring to FIGS. 1 to 3, a display device 1 according to an embodiment may be used for portable electronic devices such as mobile phones, smartphones, tablet personal computers (PCs), mobile communication terminals, electronic notebooks, electronic books, portable multimedia players (PMPs), navigations, and ultra mobile PCs (UMPCs). For example, the display device 1 according to an embodiment may be applicable to a display unit of a television, a notebook PC, a monitor, a billboard, or the Internet of Things (IoT).

The display device 1 has a three-dimensional shape. For example, the display device 1 may have a rectangular parallelepiped or a similar three-dimensional shape. In the drawings, a direction parallel to a first side of the display device 1 is represented as a first direction DR1, a direction parallel to a second side of the display device 1 is represented as a second direction DR2, and a thickness direction of the display device 1 is represented as a third direction DR3. Unless explicitly described to the contrary, the term "direction" as used herein may refer to all directions directed to both sides extending in the direction. When it is necessary to define directions extending in two directions, one side extending in one direction is represented by "one side of a direction" and the other side extending in the other direction is represented by "the other side of a direction". In FIG. 1, a direction in which an arrow is pointing is referred to as one side, and the opposite direction is referred to as the other side. The first direction DR1 and the second direction DR2 may be perpendicular to each other, the first direction DR1 and the third direction DR3 may be perpendicular to each other, and the second direction DR2 and the third direction DR3 may be perpendicular to each other.

The display device 1 may have a planar shape similar to a quadrangle. For example, the display device 1 may have a planar shape similar to a quadrangle having short sides in the first direction DR1 and long sides in the second direction DR2 as shown in FIG. 1. A corner at which the long side in the first direction DR1 meets the short side in the second direction DR2 may be rounded to have a certain curvature or formed at a right angle. A planar shape of the display device 1 is not limited to a quadrilateral shape and may be formed in another shape such as a polygonal shape, a circular shape, or an elliptical shape.

The display device 1 may include a display area DA where images are displayed on a surface on one side in the third direction DR3 (hereinafter referred to as an "upper surface") and a non-display area NDA which is an area other than the display area DA and has no images displayed therein. For example, the display area DA may be disposed on a portion of the upper surface of the display device 1, both surfaces of the display device 1 in the second direction DR2, both surfaces in the first direction DR1 (hereinafter referred to as "side surfaces"), and the other surface in the third direction DR3 (hereinafter referred to as a "lower surface"), but embodiments are not limited thereto. In some embodiments, the non-display area NDA may be disposed in such a manner to surround the edge of the display area DA, but embodiments are not limited thereto.

Pixels PX that display a screen may be arranged in the display area DA of the display device 1. As will be described below, connection lines CL, first pads PAD1, second pads PAD2, and side wirings 100 may be disposed as wirings for driving the pixels PX in the non-display area NDA of the display device 1. A detailed description thereof will be omitted.

The display area DA and the non-display area NDA of the display device 1 may be applied to a substrate SUB which will be described below.

The substrate SUB may form a base of the display device 1. In some embodiments, the substrate SUB may include glass as a rigid substrate SUB having rigidity, but embodiments are not limited thereto. For example, the substrate SUB may include polyimide as a flexible substrate SUB having flexibility. Hereinafter, for convenience of explanation, a description will be given focusing on an example in which the substrate SUB includes glass as a rigid substrate SUB.

The substrate SUB may include a main body portion MP and an edge portion EP.

The main body portion MP of the substrate SUB may occupy most of the substrate SUB, and the edge portion EP of the substrate SUB may be disposed on one side of the main body portion MP in the first direction DR1 and may occupy the edge of the substrate SUB. In some embodiments, the edge portion EP may be disposed on one side of the main body portion MP in the first direction DR1, but embodiments are not limited thereto. For example, the edge portion EP may be disposed on both sides in the first direction DR1 and both sides in the second direction DR2, occupying the edge on both sides in the first direction DR1 and both sides in the second direction DR2 of the display device 1.

The main body portion MP of the substrate SUB may include a first surface MP_1 as a surface on one side in the third direction DR3 and a second surface MP_2 (see, e.g., FIGS. 4 and 6) as a surface on the other side in the third direction DR3. The first surface MP_1 and the second surface MP_2 may face each other in the third direction DR3.

The first surface MP_1 of the main body portion MP may overlap the display area DA and a portion of the non-display area NDA. For example, the display area DA may be disposed in the first surface MP_1, and the non-display area NDA may be formed to surround the display area DA so that a portion of the non-display area NDA may overlap the first surface MP_1. The first surface MP_1 of the main body portion MP may be parallel to the upper surface of the substrate SUB, and the second surface MP_2 of the main body portion MP may be parallel to the lower surface of the substrate SUB.

Referring to FIG. 5, the pixels PX and the connection lines CL may be disposed on the first surface MP_1 of the main body portion MP.

The pixels PX may emit light to display a screen. The pixels PX may be disposed on one region of the first surface MP_1 of the main body portion MP which overlaps the display area DA. The pixels PX may be disposed in a lattice pattern in the display area DA. For example, each of the pixels PX may include a light emitting element configured to emit light, a thin-film transistor configured to control the light-emitting element, and the like. Any types of light-emitting elements may be used as the light-emitting element. For example, the light-emitting element may be an organic light emitting diode (LED) including an organic light-emitting layer formed of an organic material, a quantum dot LED including a quantum dot light-emitting layer, an inorganic LED including an inorganic semiconductor, or a micro LED.

Connection lines CL disposed on a first area may electrically connect the pixels PX and first pads PAD1 which will be described below. The pixels PX may be disposed on one region of the first surface MP_1 of the main body portion MP which overlaps the non-display area NDA. The connection lines CL may be extended toward the edge portion EP, i.e., in the first direction DR1, and may be spaced apart from each other in the second direction DR2. In FIG. 2, it is illustrated that two connection lines CL are extended from each of the pixels PX, but the number of connection lines CL is not limited thereto.

Referring to FIG. 6, a driving portion DRV may be disposed on the second surface MP_2 of the main body portion MP.

The driving portion DRV may drive the pixels PX. The driving portion DRV may be disposed on the second surface MP_2 facing the first surface MP_1, e.g., in the third direction DR3. As the driving portion DRV is disposed on the second surface MP_2, the number of pixels PX disposed on the first surface MP_1 may be increased. Accordingly, the area occupied by the display area DA on the upper surface of the display device 1 may be increased, and the area occupied by the non-display area NDA may be reduced.

In some embodiments, the driving portion DRV may be implemented as a printed circuit board (PCB), but embodiments are not limited thereto.

The second pads PAD2 disposed on the second surface MP_2 may electrically connect the driving portion DRV and the side wirings 100. In some embodiments, as shown in FIG. 6, the driving portion DRV may be electrically connected to the second pads PAD2 disposed on the edge portion EP and be electrically connected to the side wirings 100, but embodiments are not limited thereto. For example, the driving portion DRV may be directly connected to the side wirings 100 on the edge portion EP without separate pads.

Referring to FIGS. 3 and 4, the edge portion EP of the substrate SUB may be disposed on one side of the main body portion MP in the first direction DR1. The edge portion EP may overlap the non-display area NDA and may not overlap the display area DA. The edge portion EP of the substrate SUB may be the edge that includes side surfaces connecting the upper surface and the lower surface of the substrate SUB.

In some embodiments, the edge portion EP may have a chamfered shape as shown in FIGS. 3 and 4, but embodiments are not limited thereto. For example, the edge portion EP may include a first flat surface EP_1, a first chamfered surface EP_4a, a second flat surface EP_2, a third flat surface EP_3, and a second chamfered surface EP_4b. For example, the first flat surface EP_1 may be parallel to the upper surface of the substrate SUB and may be in direct contact with the first surface MP_1 of the main body portion MP. The first chamfered surface EP_4a may be in direct contact with the first flat surface EP_1 and may be inclined inward of the substrate SUB (e.g., toward a middle portion of the substrate SUB) with respect to the first flat surface EP_1. The second flat surface EP_2 may be in direct contact with the first chamfered surface EP_4a and may be inclined inward of the substrate SUB (e.g., toward a middle portion of the substrate SUB) with respect to the first chamfered surface EP_4a. The third flat surface EP_3 may be parallel to the lower surface of the substrate SUB. The second chamfered surface EP_4b may be in direct contact with the third flat surface EP_3 and the second flat surface EP_2 and is inclined inward of the substrate SUB with respect to the third flat surface EP_3. However, embodiments are not limited thereto. In case that the edge portion EP has a chamfered shape, it is possible to prevent occurrence of damage to the display device 1 such as chipping to the side wirings 100.

In some embodiments, an angle between a plane parallel to the second flat surface EP_2 and a plane parallel to the first flat surface EP_1 may be about 90 degrees, but embodiments are not limited thereto. In some embodiments, an angle θ1 formed inside the substrate SUB by the first flat surface EP_1 and the first chamfered surface EP_4a in contact with the first flat surface EP_1 may be an obtuse angle of more than about 90 degrees, and an angle θ4 formed inside the substrate SUB by the third flat surface EP_3 and the second chamfered surface EP_4b in contact with the third flat surface EP_3 may be an obtuse angle of more than about 90 degrees. However, embodiments are not limited thereto. In some embodiments, an angle θ2 formed inside the substrate SUB by the second flat surface EP_2 and the first chamfered surface EP_4a in contact with the second flat surface EP_2 may be an obtuse angle of more than about 90 degrees, and an angle θ3 formed inside the substrate SUB by the second flat surface EP_2 and the second chamfered surface EP_4b in contact with the second flat surface EP_2 may be an obtuse angle of more than about 90 degrees. However, embodiments are not limited thereto.

According to the above-described configuration, the surface on one side of the substrate SUB in the third direction DR3 (hereinafter referred to as an "upper surface") may include the first surface MP_1 of the main body portion MP and the first flat surface EP_1 of the edge portion EP, the surface on the other side in the third direction DR3 (hereinafter referred to as a "lower surface") may include the second surface MP_2 of the main body portion MP and the third flat surface EP_3 of the edge portion EP, and the surface on one side of the substrate SUB in the first direction DR1 (hereinafter referred to as a "side surface") may include the first chamfered surface EP_4a of the edge portion EP, the second flat surface EP_2, and the second chamfered surface EP_4b.

The first pads PAD1, the second pads PAD2, and the side wirings 100 on the edge portion EP of the substrate SUB.

The first pads PAD may electrically connect the connection lines CL and the side wirings 100. The first pads PAD1 may be disposed on the first flat surface EP_1 of the edge portion EP on the upper surface of the display device 1. The first pads PAD1 disposed on the first flat surface EP_1 may be positioned between the pixels PX and the side wirings 100 as shown in FIG. 5. The second pads PAD2 may be disposed on the third flat surface EP_3 of the edge portion EP on the lower surface of the display device 1. The second pads PAD2 disposed on the third flat surface EP_3 may be positioned between the driving portion DRV and the side wirings 100 as shown in FIG. 6. In some embodiments, the other end of the first pad PAD1 in the first direction DR1 and the boundary between the first flat surface EP_1 and the first surface MP_1 may be aligned with each other, and the other end of the second pad PAD2 in the first direction DR1 and the boundary between the third flat surface EP_3 and the second surface MP_2 may be aligned with each other. However, embodiments are not limited thereto.

Referring to FIGS. 3 to 6, the side wirings 100 may electrically connect the pixels PX and the driving portion DRV. The side wirings 100 may be disposed on the side surface of the substrate SUB and extended in the third direction DR3, and may be spaced apart from each other in the second direction DR2. For example, the side wirings 100 may cover a portion of the first flat surface EP_1 of the edge portion EP, the surface of the first chamfered surface EP_4a, the surface of the second flat surface EP_2, the surface of the second chamfered surface EP_4b, and a portion of the third flat surface EP_3. For example, the side wirings 100 may continuously extend to cover the portion of the first flat surface EP_1 of the edge portion EP, the surface of the first chamfered surface EP_4a, the surface of the second flat surface EP_2, the surface of the second chamfered surface EP_4b, and the portion of the third flat surface EP_3.

The side wirings 100 may include a first side wiring 110 and a second side wiring 120 adjacent to the first side wiring 110. The first side wiring 110 and the second side wiring 120 may be spaced apart from each other in the second direction DR2. The first side wiring 110 and the second side wiring 120 may be repeatedly disposed in the second direction DR2.

The first side wiring 110 may include a first upper part 110a adjacent to the pixels PX, a first lower part 110c adjacent to the driving portion DRV, and a first connecting part 110b disposed between the first upper part 110a and the first lower part 110c to connect the first upper part 110a and the first lower part 110c. The first upper part 110a, the first connection part 110b, and the first lower part 110c may be integral with each other. The first upper part 110a may include a first_first upper part 110a_1 overlapping the first pad PAD1 disposed on the first flat surface EP_1 and a first_second upper part 110a_2 in direct contact with the first chamfered surface EP_4a. The first lower part 110c may include a first_first lower part 110c_1 overlapping the second pad PAD2 disposed on the third flat surface EP_3 and a first_second lower part 110c_2 in direct contact with the second chamfered surface EP_4b. At least one of a width of the first upper part 110a in the second direction DR2 or a width of the first lower part 110c in the second direction DR2 may be greater than a width of the first connecting part 110b in the second direction DR2. In some embodiments, the width of the first upper part 110a in the second direction DR2 and the width of the first lower part 110c in the second direction DR2 may be greater than the width of the first connecting part 110b in the second direction DR2, but embodiments are not limited thereto. Hereinafter, for convenience of explanation, a description will be given focusing on an example in which the width of the first upper part 110a in the second direction DR2 and the width of the first lower part 110c in the second direction DR2 are greater than the width of the first connection part 110b in the second direction DR2.

The second side wiring 120 may include a second upper part 120a adjacent to the pixels PX, a second lower part 120c adjacent to the driving portion DRV, and a second connecting part 120b disposed between the second upper part 120a and the second lower part 120c to connect the second upper part 120a and the second lower part 120c. The second upper part 120a, the second connection part 120b, and the second lower part 120c may be integral with each other. The second upper part 120a may include a second_first upper part 120a_1 overlapping the first pad PAD1 disposed on the first flat surface EP_1 and a second_second upper part 120a_2 in direct contact with the first chamfered surface EP_4a. The second lower part 120c may include a second_first lower part 120c_1 overlapping the second pad PAD2 disposed on the third flat surface EP_3 and a second_second lower part 120c_2 in direct contact with the second chamfered surface EP_4b. At least one of a width of the second upper part 120a in the second direction DR2 or a width of the second lower part 120c in the second direction DR2 may be greater than a width of the second connecting part 120b in the second direction DR2. In some embodiments, the width of the second upper part 120a in the second direction DR2 and the width of the second lower part 120c in the second direction DR2 may be greater than the width of the second connecting part 120b in the second direction DR2, but embodiments are not limited thereto. Hereinafter, for convenience of explanation, a description will be given focusing on an example in which the width of the second upper part 120a in the second direction DR2 and the width of the second lower part 120c in the second direction DR2 are greater than the width of the second connection part 120b in the second direction DR2.

The side wirings 100 may include metal. For example, the side wirings 100 may include silver (Ag) or copper (Cu), but embodiments are not limited thereto.

The side wirings 100 may be formed by applying a silver or copper paste to a silicon (Si) mold and transferring the paste onto the side surface of the substrate SUB. For example, a silver or copper paste may be applied over the entire side surface of the substrate SUB and etched to form the side wirings 100. Hereinafter, for convenience of explanation, a description will be given focusing on an example in which the side wirings 100 are formed by applying a silver or copper paste to a silicon mold and transferring the paste onto the side surface of the substrate SUB. For example, the side wirings 100 may be formed to be thin at a first_first edge DL_1a defined as a boundary between the first flat surface EP_1 and the first chamfered surface EP_4a, a first_second edge DL_1b defined as a boundary between the first chamfered surface EP_4a and the second flat surface EP_2, a second_first edge DL_2a defined as a boundary between the second flat surface EP_2 and the second chamfered surface EP_4b, and a second_second edge DL_2b defined as a boundary between the second chamfered surface EP_4b and the third flat surface EP_3, so that there is a risk of disconnection of the side wirings 100. Accordingly, the width of the side wirings 100 may need to be widened at the first_first edge DL_1a, the first_second edge DL_1b, the second_first edge DL_2a, and the second_second edge DL_2b to prevent disconnection of the side wirings 100.

Hereinafter, a shape of the first side wiring 110, a shape of the second side wiring 120, and the use of the display device 1 according to an embodiment will be described in detail.

Figure 7:
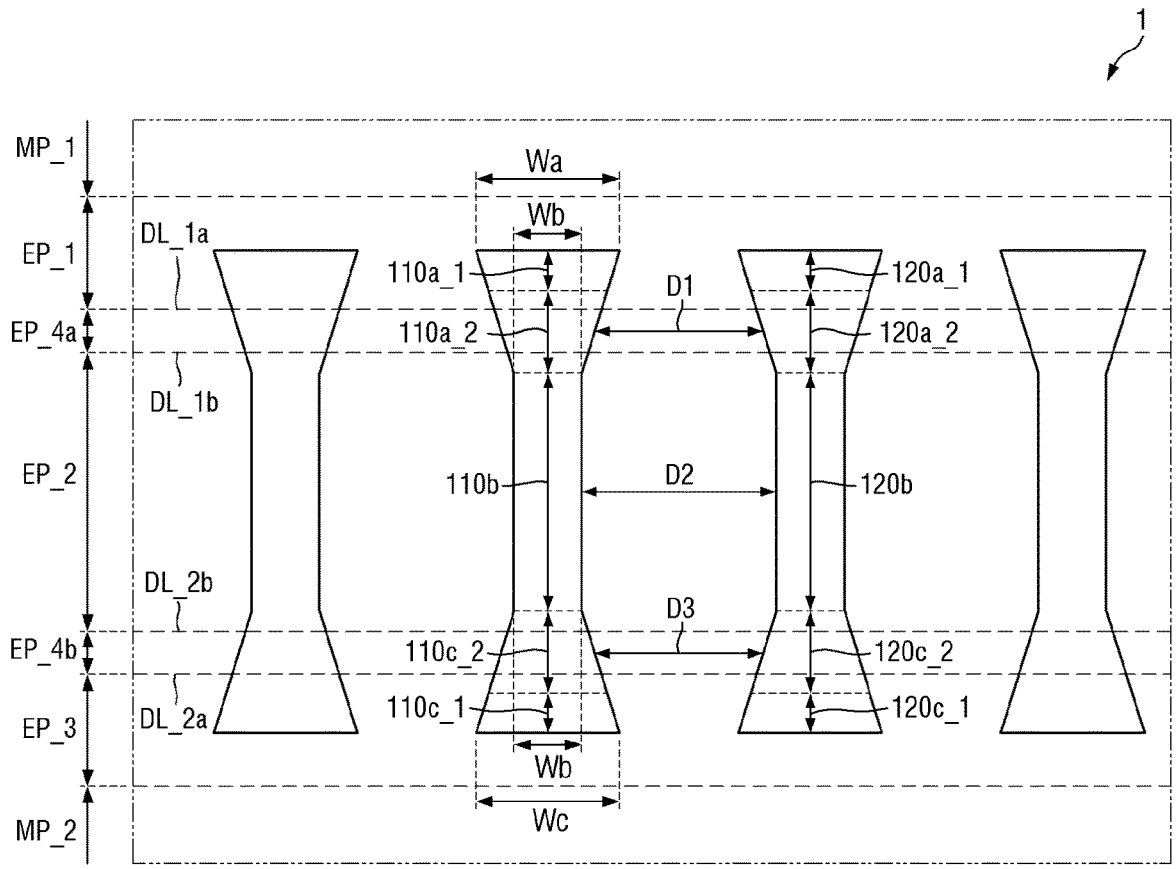
FIG. 7 is a schematic exploded plan view illustrating the first surface and the second surface of the main body portion of the substrate of the display device of FIG. 1 according to an embodiment.
Figure 8:
FIG. 8 is a schematic plan view of a tiled display device formed by a plurality of display devices according to an embodiment.

FIG. 7 is a schematic exploded view illustrating the first surface and the second surface of the main body portion of the substrate of the display device according to an embodiment of FIG. 1. FIG. 8 is a schematic plan view of a tiled display device formed by display devices according to an embodiment.

In case that the first surface MP_1 and the second surface MP_2 of the main body portion MP, the first flat surface EP_1, the second flat surface EP_2, the third flat surface EP_3, the first chamfered surface EP_4a, and the second chamfered surface EP_4b of the edge portion EP in FIG. 4 are disposed on a plane parallel to the second flat surface EP_2, it may be illustrated as FIG. 7. In case that the surfaces other than the second flat surface EP_2 of the edge portion EP are spread to be disposed on a plane parallel to the second flat surface EP_2, the second surface MP_2 of the main body portion MP, the third flat surface EP_3 of the edge portion EP, the second chamfered surface EP_4b of the edge portion EP, the second flat surface EP_2 of the edge portion EP, the first chamfered surface EP_4a of the edge portion EP, the first flat surface EP_1 of the edge portion EP, and the first surface of the main body portion MP may be sequentially arranged in this order in the third direction DR3. For convenience of explanation, the first pad PAD1, the second pad PAD2, and the connection lines CL are omitted in FIG. 7.

For example, the first_first edge DL_1a is defined as a boundary between the first flat surface EP_1 and the first chamfered surface EP_4a, the first_second edge DL_1b is defined as a boundary between the first chamfered surface EP_4a and the second flat surface EP_2, the second_first edge DL_2a is defined as a boundary between the second flat surface EP_2 and the second chamfered surface EP_4b, and the second_second edge DL_2b is defined as a boundary between the second chamfered surface EP_4b and the third flat surface EP_3. The first_first edge DL_1a, the first_second edge DL_1b, the second_first edge DL_2a, and the second_second edge DL_2b may be straight lines parallel to the second direction DR2.

Referring to FIG. 7, the width of the first upper part 110a of the first side wiring 110 in the second direction DR2 may be greater than the width of the first connection part 110b in the second direction DR2, and the width of the first lower part 110c in the second direction DR2 may be greater than the width of the first connecting part 110b in the second direction DR2.

The width of the first upper part 110a of the first side wiring 110 in the second direction DR2 may gradually increase as being closer to one side in the third direction DR3. In some embodiments, as the maximum width of the first upper part 110a in the second direction DR2, a width Wa of one end in the third direction DR3 may be greater than a width Wb of the first connecting part 110b in the second direction DR2, and as the minimum width of the first upper part 110a in the second direction DR2, a width of a portion in contact with the first connecting part 110b in the second direction DR2 may be substantially equal to the width Wb of the first connecting part 110b in the second direction DR2. However, embodiments are not limited thereto.

The width of the first lower part 110c of the first side wiring 110 in the second direction DR2 may gradually increase as being closer to the other end thereof in the third direction DR3. In some embodiments, as the maximum width of the first lower part 110c in the second direction DR2, a width Wc of the other end in the third direction DR3 may be greater than the width Wb of the first connecting part 110b in the second direction DR2, and as the minimum width of the first lower part 110c in the second direction DR2, a width of a portion in contact with the first connecting part 110b in the second direction DR2 may be substantially equal to the width Wb of the first connecting part 110b in the second direction DR2. However, embodiments are not limited thereto.

The first upper part 110a of the first side wiring 110 may correspond to the second upper part 120a of the second side wiring 120, and the first connecting part 110b may correspond to the second connecting part 120b. The first lower part 110c may correspond to the second lower part 120c. In some embodiments, the shape of the first side wiring 110 and the shape of the second side wiring 120 may be substantially the same, but embodiments are not limited thereto. Hereinafter, for convenience of explanation, a description will be given focusing on an example in which the shape of the first side wiring 110 and the shape of the second side wiring 120 are the same to each other, and a detailed description of the shape of the second side wiring 120 will be omitted.

The first upper part 110a of the first side wiring 110 may prevent disconnection of the side wiring 100. As described above, the first upper part 110a may include a first_first upper part 110a_1 overlapping the first pad PAD1 and a first_second upper part 110a_2 not overlapping the first pad PAD1. For example, a boundary between the first_first upper part 110a_1 and the first_second upper part 110a_2 may be disposed on the first flat surface EP_1, and a boundary between the first_second upper part 110a_2 and the first connecting part 110b may be disposed on the second flat surface EP_2. For example, the first_second upper part 110a_2 may cover a portion of the first flat surface EP_1, the surface of the first chamfered surface EP_4a, and a portion of the second flat surface EP_2. For example, the first_second upper part 110a_2 may continuously extend to cover the portion of the first flat surface EP_1, the surface of the first chamfered surface EP_4a, and the portion of the second flat surface EP_2. Accordingly, the first_second upper part 110a_2 may cover the first_first edge DL_1a and the first_second edge DL_1b.

The first connecting part 110b may connect the first upper part 110a and the first lower part 110c. The first connecting part 110b may be disposed on the second flat surface EP_2. In some embodiments, the first connecting part 110b may have a rectangular shape having a substantially constant width in the second direction DR2, but embodiments are not limited thereto.

The first lower part 110c may prevent disconnection of the side wiring 100. As described above, the first lower part 110c may include a first_first lower part 110c_1 overlapping the second pad PAD2 and a first_second lower part 110c_2 not overlapping the second pad PAD2. For example, a boundary between the first_first lower part 110c_1 and the first_second lower part 110c_2 may be disposed on the third flat surface EP_3, and a boundary between the first_second lower part 110c_2 and the first connecting part 110b may be disposed on the second flat surface EP_2. For example, the first_second lower part 110c_2 may cover a portion of the third flat surface EP_3, the surface of the second chamfered surface EP_4b, and a portion of the second flat surface EP_2. For example, the first_second lower part 110c_2 may continuously extend to cover the portion of the third flat surface EP_3, the surface of the second chamfered surface EP_4b, and the portion of the second flat surface EP_2. Accordingly, the first_second lower part 110c_2 may cover the second_first edge DL_2a and the second_second edge DL_2b.

The width of the first lower part 110c in the second direction DR2 and the width of the first connecting part 110b in the second direction DR2 on the boundary between the first lower part 110c and the first connecting part 110b may be substantially the same as each other. Accordingly, the width of the first_second lower part 110c_2 in the second direction DR2 which covers the second_first edge DL_2a and the second_second edge DL_2b may be greater than the width of the first connecting part 110b in the second direction DR2. In some embodiments, the width of the first lower part 110c in the second direction DR2 may gradually increase as being closer to the other end in the third direction DR3, but embodiments are not limited thereto.

For example, a distance between the first side wiring 110 and the second side wiring 120 may vary according to the positions. For example, a distance D1 between the first upper part 110a of the first side wiring 110 and the second upper part 120a of the second side wiring 120 may be smaller than a distance D2 between the first connecting part 110b and the second connecting part 120b, and a distance D3 between the first lower part 110c and the second lower part 120c may be smaller than the distance D2 between the first connecting part 110b and the second connecting part 120b.

In some embodiments, the distance D1 between the first upper part 110a and the second upper part 120a may increase along one side in the third direction DR3 and the distance D3 between the first lower part 110c and the second lower part 120c may increase along the other side in the third direction DR3, but embodiments are not limited thereto.

With the shape of the first side wiring 110 as described above, the width of the first upper part 110a covering the first_first edge DL_1a and the first_second edge DL_1b is wide, so that the possibility that a disconnection occurs at the first_first edge DL_1a and the first_second edge DL_1b may be reduced. Also, the width of the first lower part 110c covering the second_first edge DL_2a and the second_second edge DL_2b is wide, so that the possibility that a disconnection occurs at the second_first edge DL_2a and the second_second edge DL_2b may be reduced.

Referring to FIG. 8, the display device 1 according to an embodiment may be provided in plural and arranged in a lattice pattern to form a tiled display that implements a large screen. For example, the display device 1 according to an embodiment may correspond to one cell of the tiled display or function as one cell of the tiled display, and may display a portion of the screen to be implemented by the tiled display. Therefore, it is necessary to minimize the non-display area NDA. With the configuration as described above, the non-display area NDA of the upper surface of the display device 1 according to an embodiment is minimized, while preventing disconnection of the side wirings 100 disposed on the side surface, so that the tiled display may be effectively formed or reliably implemented.

Hereinafter, other embodiments of the display device 1 will be described. In the following embodiments, like reference numerals are used for like or corresponding elements to those of embodiments described above and redundant descriptions are omitted or briefly made, and the following description will focus on differences for descriptive convenience.

Figure 9:
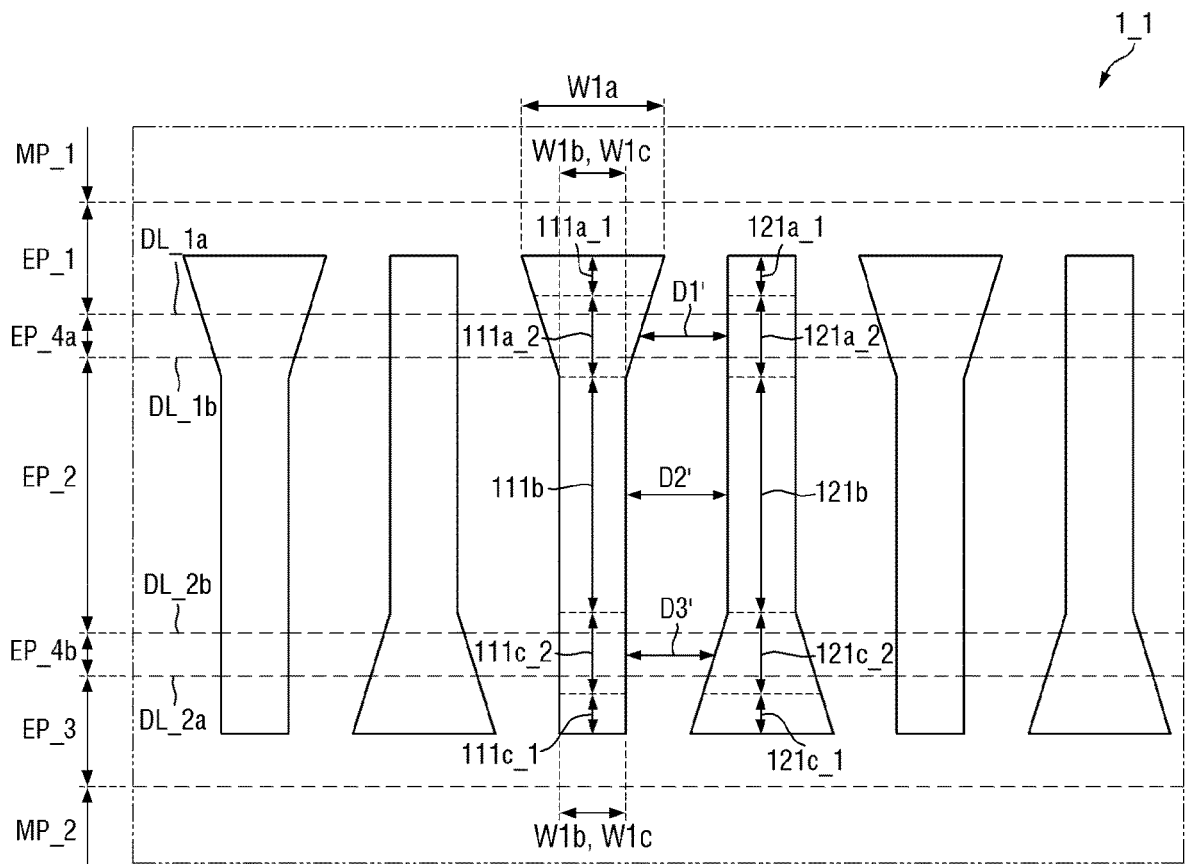
FIG. 9 is a schematic exploded view illustrating a first surface and a second surface of a main body portion of a substrate of a display device according to an embodiment.

FIG. 9 is a schematic exploded view illustrating a first surface and a second surface of a main body portion of a substrate of a display device according to an embodiment.

Referring to FIG. 9, shapes of a first side wiring 111 and a second side wiring 121 of a display device 1_1 according to an embodiment may have a 180-degree rotational symmetric relation (e.g., inverse rotation relation) with respect to the second direction DR2. For example, in the first side wiring 111, a width of a first upper part 111a in the second direction DR2 may be greater than a width of a first connecting part 111b in the second direction DR2 and a width of a first lower part 111c in the second direction DR2. In the second side wiring 121, a width of a second lower part 121c in the second direction DR2 may be greater than a width of a second connecting part 121b in the second direction DR2 and a width of a second upper part 121a in the second direction DR2.

As the shapes of the first side wiring 111 and the second side wiring 121 of the display device 1_1 according to an embodiment have a 180-degree rotational symmetric relation (e.g., inverse rotation relation), the first upper part 111a of the first side wiring 111 may correspond to the second lower part 121c of the second side wiring 121, the first connecting part 111b of the first side wiring 111 may correspond to the second connecting part 121b of the second side wiring 121, and the first lower part 111c of the first side wiring 111 may correspond to the second upper part 121a. The first side wiring 111 and the second side wiring 121 have substantially the same shapes with only different orientations, and hence a description will focus on the first side wiring 111, and a detailed description of the second side wiring 121 will be omitted for descriptive convenience.

The width of the first upper part 111a of the first side wiring 111 in the second direction DR2 may increase as being closer to one side in the third direction DR3. In some embodiments, as the maximum width of the first upper part 111a in the second direction DR2, a width W1a of one end in the third direction DR3 may be greater than a width W1b of the first connecting part 111b in the second direction DR2, and as the minimum width of the first upper part 111a in the second direction DR2, a width of a portion in contact with the first connecting part 111b in the second direction DR2 may be substantially equal to the width W1b of the first connecting part 111b in the second direction DR2. However, embodiments are not limited thereto.

In some embodiments, the width W1b of the first upper part 111a of the first side wiring 111 in the second direction DR2 may be substantially equal to the width W1c of the first lower part 111c in the second direction DR2, but embodiments are not limited thereto.

Accordingly, a distance for avoiding or preventing an electric short circuit between the first side wiring 111 and the second side wiring 121 becomes relatively short, so that the distances D1', D2', and D3' between the first side wiring 111 and the second side wiring 121 may decrease as a whole, and the density of the side wirings disposed on the edge portion EP may increase.

Figure 10:
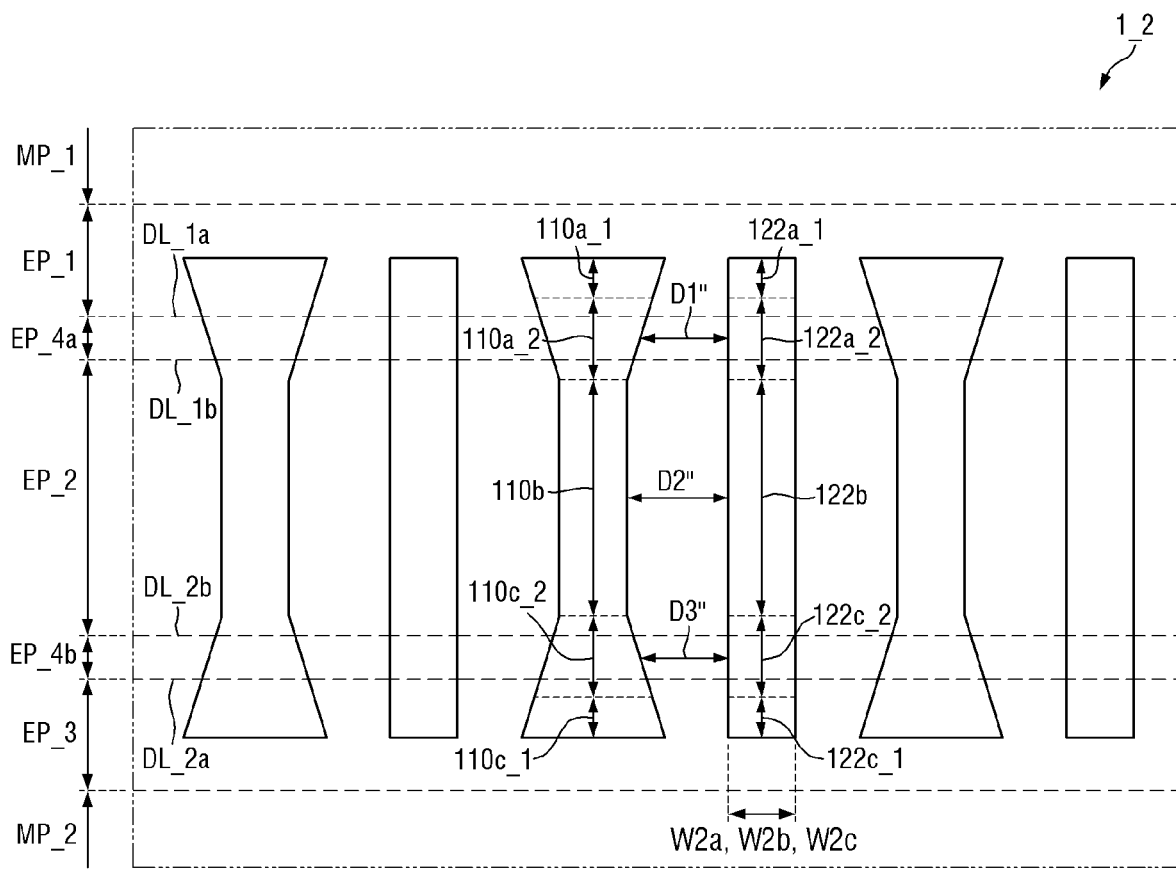
FIG. 10 is a schematic exploded view illustrating a first surface and a second surface of a main body portion of a substrate of a display device according to an embodiment.

FIG. 10 is a schematic exploded view illustrating a first surface and a second surface of a main body portion of a substrate of a display device according to another embodiment.

Referring to FIG. 10, in a display device 1_2 according to an embodiment, a width of a first side wiring 110 may be greater than a width of a second side wiring 122. For example, a shape of the first side wiring 110 according to an embodiment is substantially the same as that of the first side wiring 110 as shown in FIG. 7, and a width of the second side wiring 122 according to an embodiment in the second direction DR2 may be smaller than a width of a first upper part 110a of the first side wiring 110 in the second direction DR2.

In some embodiments, a width W2a of a second upper part 122a of the second side wiring 122 in the second direction DR2, a width W2b of a second connecting part 122b in the second direction DR2, and a width W2c of a second lower part 122c in the second direction DR2 may be substantially equal to one another, but embodiments are not limited thereto.

Accordingly, a distance for avoiding or preventing an electric short circuit between the first side wiring 110 and the second side wiring 122 becomes relatively short, so that the distances D1″, D2″, and D3″ between the first side wiring 110 and the second side wiring 122 may decrease as a whole, and the density of the side wirings disposed on the edge portion EP may increase.

Figure 11:
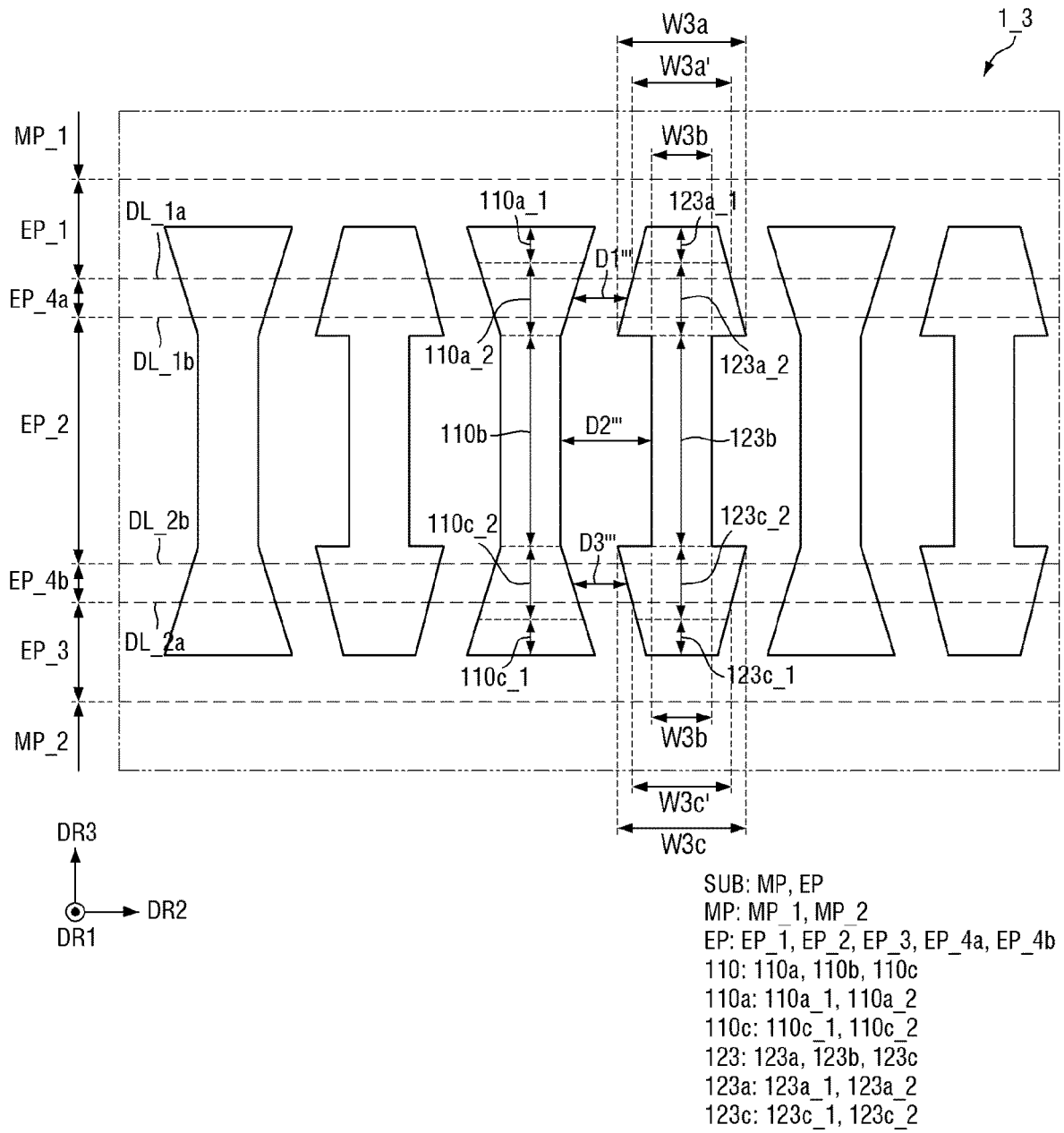
FIG. 11 is a schematic exploded view illustrating a first surface and a second surface of a main body portion of a substrate of a display device according to an embodiment.

FIG. 11 is a schematic exploded view illustrating a first surface and a second surface of a main body portion of a substrate of a display device according to an embodiment.

Referring to FIG. 11, a shape of a first upper part 110a of a first side wiring 110 of a display device 1_3 according to an embodiment and a shape of a second upper part 123a of the second side wiring 123 have a 180-degree rotational symmetric relation (e.g., inverse rotation relation), and a shape of a first lower part 110c of the first side wiring 110 and a shape of a second lower part 123c of the second side wiring 123 have a 180-degree rotational symmetric relation (e.g., inverse rotation relation). For example, a width of the first upper part 110a of the first side wiring 110 in the second direction DR2 may increase along one side in the third direction DR3, a width of the second upper part 123a of the second side wiring 123 may decrease along one side in the third direction, a width of the first lower part 110c of the first side wiring 110 in the second direction DR2 may increase along the other side in the third direction DR3, and a width of the second lower part 123c of the second side wiring 123 in the second direction DR2 may decrease along the other side in the third direction DR3. The first side wiring 110 according to an embodiment is substantially the same as the first side wiring 110 as shown in FIG. 7, and hence a description will focus on the second side wiring 123, and a detailed description of the first side wiring 110 will be omitted for descriptive convenience.

The width of the second upper part 123a in the second direction DR2 may decrease along one side in the third direction DR3, but may be greater than the width of a second connecting part 123b in the second direction DR2. In some embodiments, as the maximum width of the second upper part 123a in the second direction DR2, a width W3a of a portion in contact with the second connecting part 123b in the second direction DR2 may be greater than a width W3b of the second connecting part 123b in the second direction DR2, and a width W3a' of the second upper part 123a covering a first_first edge DL_1a in the second direction DR2 may be smaller than the width W3a of the portion in contact with the second connecting part 123b in the second direction DR2 and may be greater than the width W3b of the second connecting part 123b in the second direction DR2. However, embodiments are not limited thereto. For example, a width of a second_second upper part 123a_2 in the second direction DR2 may be greatest in a boundary area adjacent to the second connecting part 123b, and may be smallest in a boundary area adjacent to the second_second upper part 123a_2 and a second_first upper part 123a_1. However, the width in the second direction DR2 of the second_second upper part 123a_2 in the boundary area adjacent to the second_first upper part 123a_1 may be greater than the width of the second connecting part 123b in the second direction DR2.

The second connecting part 123b may connect the second upper part 123a and the second lower part 123c. The width W3b of the second connecting part 123b in the second direction DR2 may be smaller than the width of the second upper part 123a in the second direction DR2 and the width of the second lower part 123c in the second direction DR2. In some embodiments, the second connecting part 123b may have a rectangular shape in which the width in the second direction DR2 is substantially constant along the third direction, but embodiments are not limited thereto.

The width of the second lower part 123c in the second direction DR2 may decrease along the other side in the third direction DR3, but may be greater than the width of the second connecting part 123b in the second direction DR2. In some embodiments, as the maximum width of the second lower part 123c in the second direction DR2, a width W3c of a portion in contact with the second connecting part 123b in the second direction DR2 may be greater than the width W3b of the second connecting part 123b in the second direction DR2, and a width W3c' of the second lower part 120c covering a second_first edge DL_2a in the second direction DR2 may be smaller than the width W3c of the portion in contact with the second connecting part 123b in the second direction DR2 and may be greater than the width W3b of the second connecting part 123b in the second direction DR2. However, embodiments are not limited thereto. For example, a width of a second_second lower part 123c_2 in the second direction DR2 may be greatest in a boundary area adjacent to the second connecting part 123b, and may be smallest in a boundary area adjacent to the second_second lower part 123c_2 and a second_first lower part 123c_1. However, the width in the second direction DR2 of the second_second upper part 123a_2 in the boundary area adjacent to the second_first lower part 123c_1 may be greater than the width of the second connecting part 123b in the second direction DR2.

A distance D1‴ between the first upper part 110a and the second upper part 123a and a distance D3‴ between the first lower part 110c and the second lower part 123c may be smaller than a distance D2‴ between the first connecting part 110b and the second connecting part 123b. In some embodiments, the distance D1‴ between the first upper part 110a of the first side wiring 110 and the second upper part 123a of the second side wiring 123, the distance D2‴ between the first connecting part 110b and the second connecting part 123b, and the distance D3‴ between the first lower part 110c and the second lower part 123c may each be substantially constant along the third direction DR3. However, embodiments are not limited thereto.

With the configuration as described above, the widths of the first side wiring 110 and the second side wiring 123 may be increased to prevent a disconnection, as well as a distance for avoiding or preventing an electrical short circuit between the first side wiring 110 and the second side wiring 123 may be relatively short, so that the distances D1‴, D2‴, and D3‴ between the first side wiring 110 and the second side wiring 123 may decrease as a whole, and the density of the side wirings disposed on the edge portion EP may increase.

Figure 12:
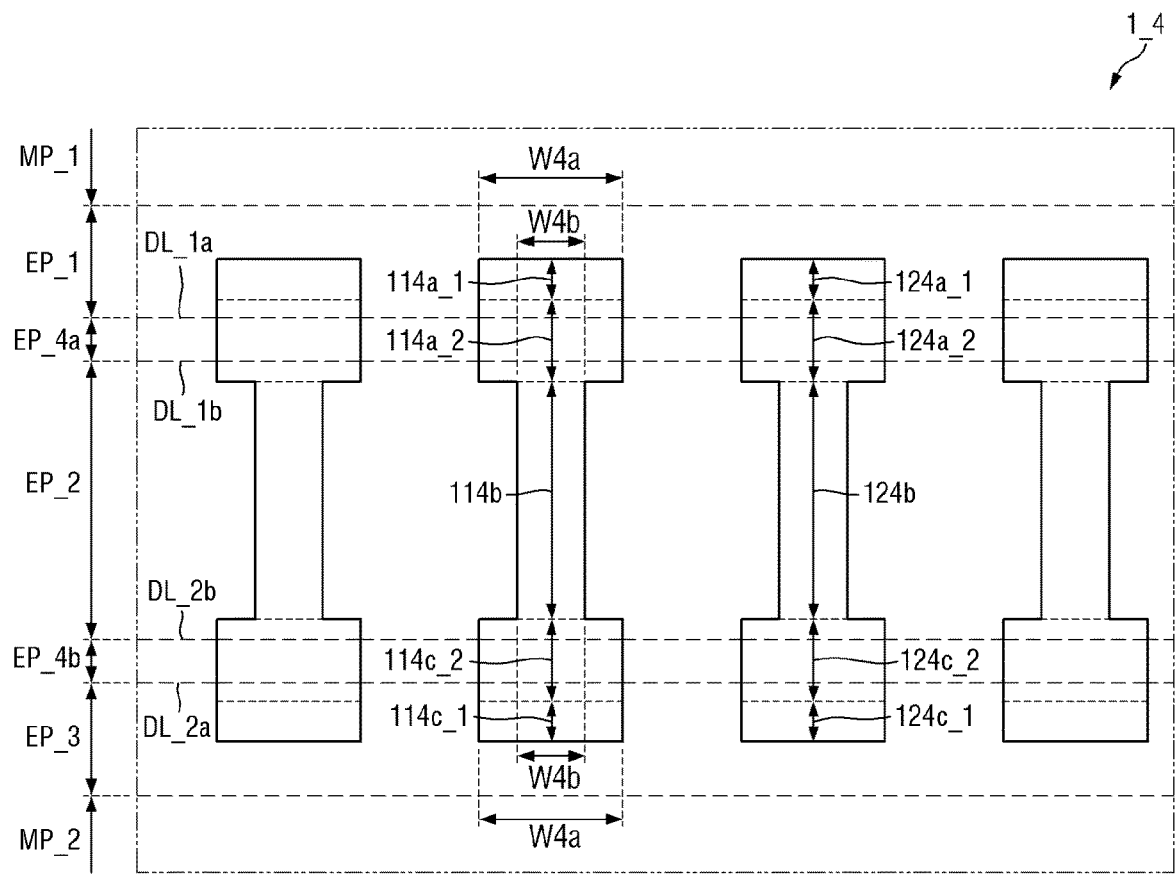
FIG. 12 is a schematic exploded view illustrating a first surface and a second surface of a main body portion of a substrate of a display device according to an embodiment.

FIG. 12 is a schematic exploded view illustrating a first surface and a second surface of a main body portion of a substrate of a display device according to an embodiment.

Referring to FIG. 12, a display device 1_4 according to an embodiment is different from the display device 1 as shown in FIG. 7 in that the width of each of a first upper part 114a, a first lower part 114c, a second upper part 124a, and a second lower part 124c in the second direction DR2 is substantially constant, e.g., along the third direction DR3. The other configuration is substantially the same or similar to that of the display device 1 as shown in FIG. 7. For example, a shape of each of the first upper part 114a, the first lower part 114c, the second upper part 124a, and the second lower part 124c may be rectangular, but embodiments are not limited thereto.

In some embodiments, shapes of a first side wiring 114 and a second side wiring 124 may be the same as each other, but embodiments are not limited thereto. Hereinafter, for convenience of explanation, a description will focus on the shape of the first side wiring 114 and a description of the shape of the second side wiring 124 will be omitted for descriptive convenience.

A width W4a of the first upper part 114a of the first side wiring 114 in the second direction DR2 may be greater than a width W4b of a first connecting part 114b in the second direction DR2. The width W4a of the first upper part 114a in the second direction DR2 may be substantially constant along the third direction DR3. For example, in a portion in contact with the first connecting part 114b, the width W4a of the first upper part 114a in the second direction DR2 may be greater than the width W4b of the first connecting part 114b in the second direction DR2. Accordingly, a width of a first_first edge DL_1a covered by the first upper part 114a in the second direction DR2 and a width of a first_second edge DL_1b covered by the first upper part 114a in the second direction DR2 are substantially the same, and thus disconnection may be more stably prevented.

The width W4c of the first lower part 114c of the first side wiring 114 in the second direction DR2 may be wider than the width W4b of the first connecting part 114b in the second direction DR2. The width W4c of the first lower part 114c in the second direction DR2 may be substantially constant along the third direction DR3. For example, in a portion in contact with the first connecting part 114b, the width W4c of the first lower part 114c in the second direction DR2 may be greater than the width W4b of the first connecting part 114b in the second direction DR2. Accordingly, a width of a second_first edge DL_2a covered by the first lower part 114c in the second direction DR2 and a width of a second_second edge DL_2b covered by the first lower part 114c in the second direction DR2 are substantially the same, and thus disconnection may be more stably prevented.

With the configuration as described above, it is possible to more stably prevent a disconnection of the side wirings.

Figure 13:
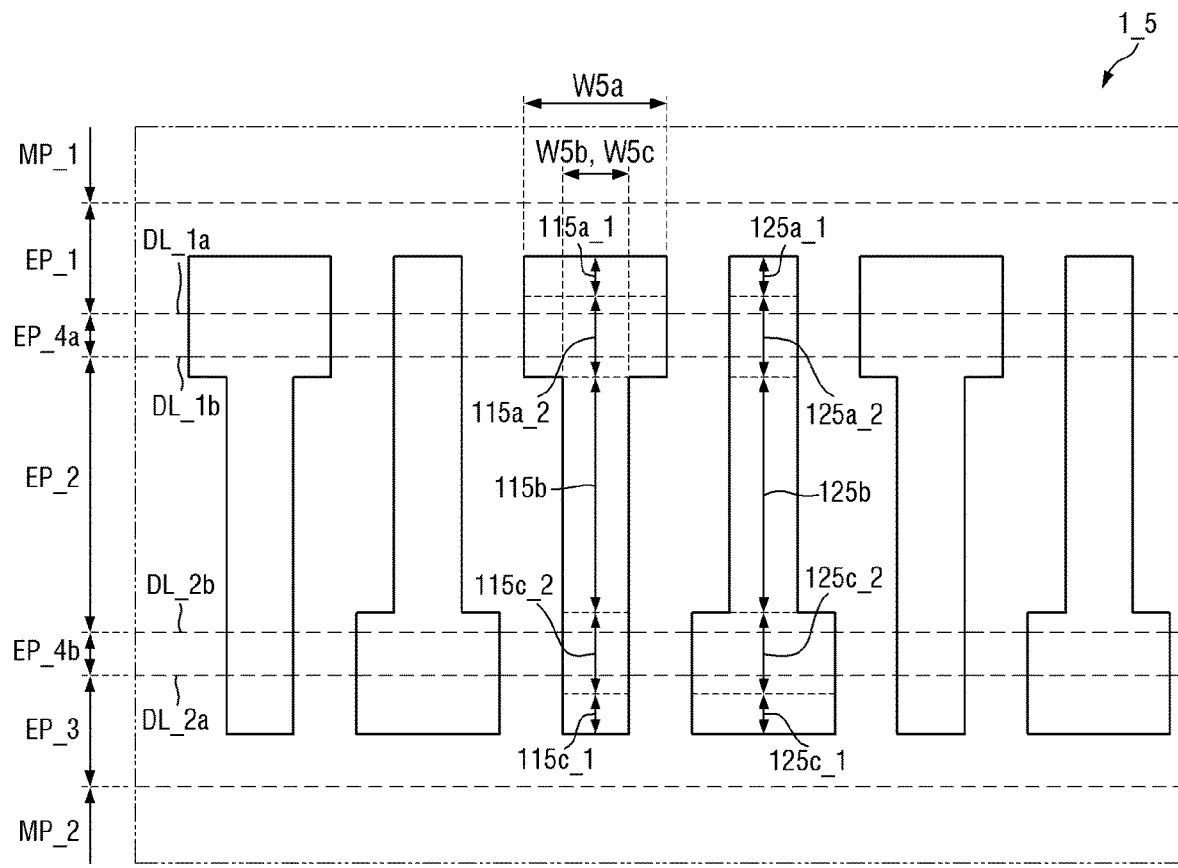
FIG. 13 is a schematic exploded view illustrating a first surface and a second surface of a main body portion of a substrate of a display device according to an embodiment.

FIG. 13 is a schematic exploded view illustrating a first surface and a second surface of a main body portion of a substrate of a display device according to an embodiment.

A display device 1_5 according to an embodiment is different from the display device 1_1 as shown in FIG. 9 in that a width of each of a first upper part 115a of a first side wiring 115 and a second lower part 125c of a second side wiring 125 in the second direction DR2 is substantially constant along the third direction DR3 as described with reference to FIG. 12. The other configuration is substantially the same or similar to that of the display device 1_1 as shown in FIG. 9. Specifically, a shape of each of the first upper part 115a and the second lower part 125c may be rectangular, but embodiments are not limited thereto.

The display device 1_5 according to an embodiment has the same shapes of the side wirings as those of the display device 1_4 as shown in FIG. 12, so that disconnection may be more stably prevented.

Figure 14:
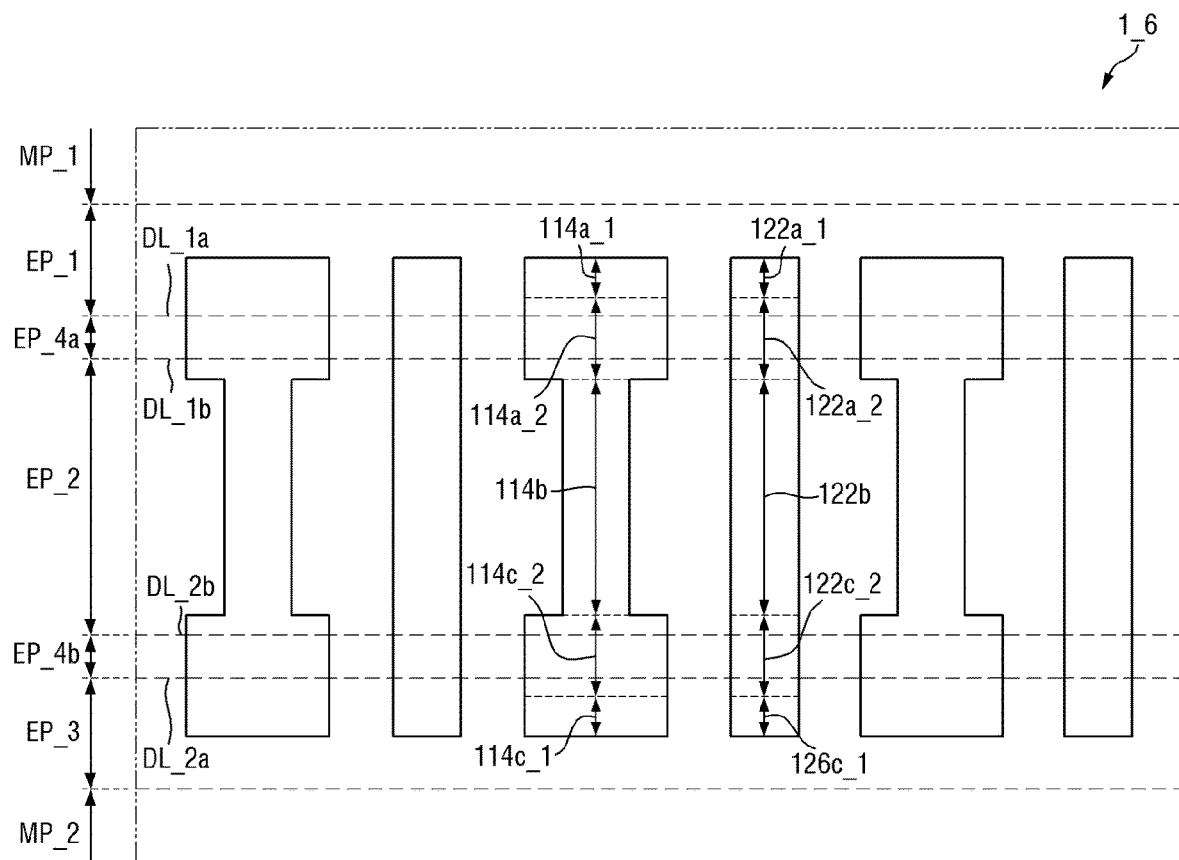
FIG. 14 is a schematic exploded view illustrating a first surface and a second surface of a main body portion of a substrate of a display device according to an embodiment.

FIG. 14 is a schematic exploded view illustrating a first surface and a second surface of a main body portion of a substrate of a display device according to an embodiment.

A display device 1_6 according to an embodiment is different from the display device 1_2 as shown in FIG. 10 in that a width of each of a first upper part 114a and a first lower part 114c of a first side wiring 114 in the second direction DR2 is substantially constant along the third direction DR3. The other configuration is substantially the same or similar to that of the display device 1_2 as shown in FIG. 10. For example, a shape of the first side wiring 114 according to an embodiment is substantially the same as that of the first side wiring 114 as shown in FIG. 12, and a shape of a second side wiring 122 according to an embodiment in the second direction DR2 may be substantially the same as that of the second side wiring 122 as shown in FIG. 10.

The display device 1_6 according to an embodiment may more stably prevent disconnection as described for the display device 1_4 as shown in FIG. 12.

Figure 15:
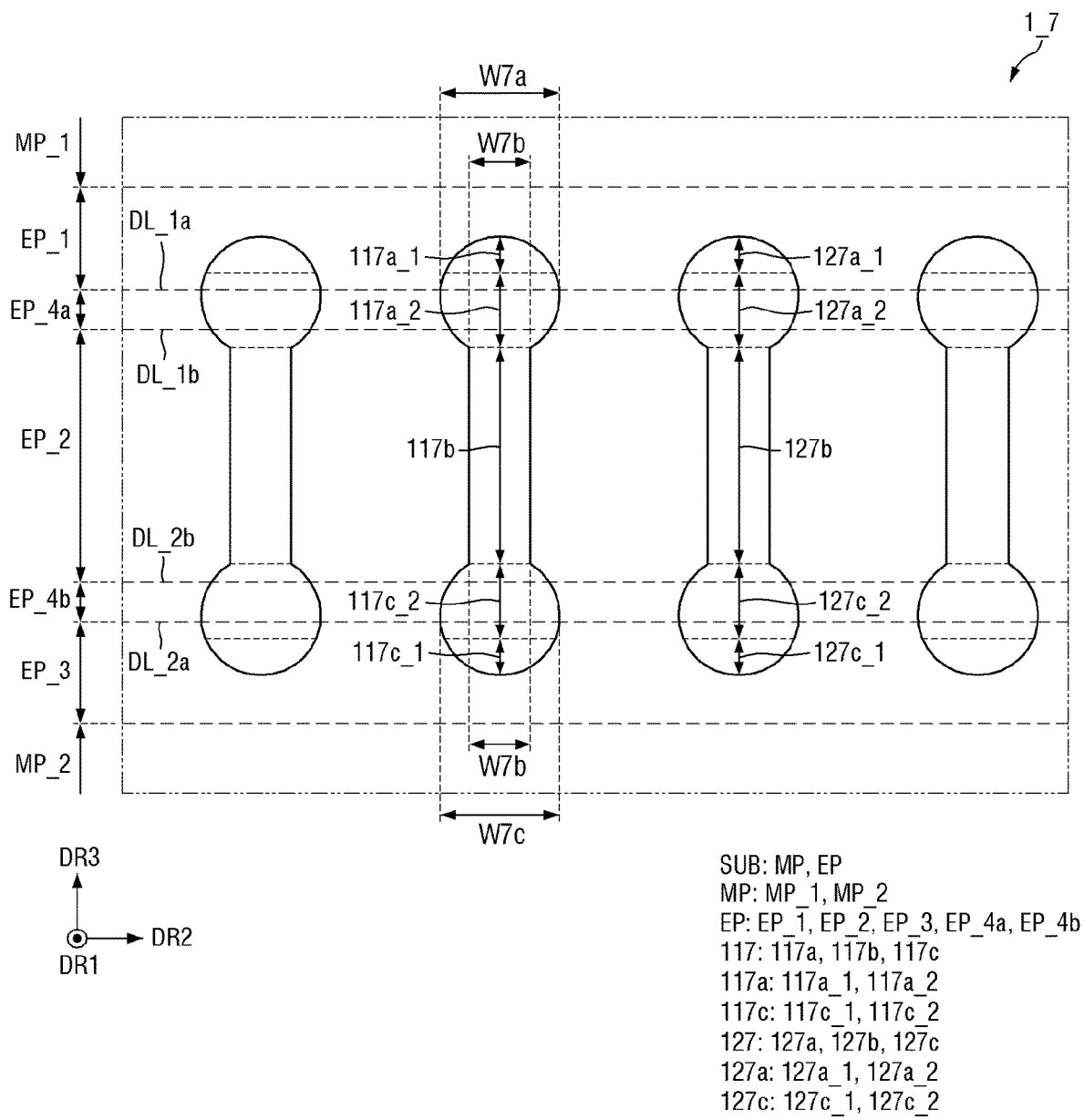
FIG. 15 is a schematic exploded view illustrating a first surface and a second surface of a main body portion of a substrate of a display device according to an embodiment.

FIG. 15 is a schematic exploded view illustrating a first surface and a second surface of a main body portion of a substrate of a display device according to an embodiment.

Referring to FIG. 15, a display device 1_7 according to an embodiment is different from the display device 1 as shown in FIG. 7 in that a width of each of a first upper part 117a, a first lower part 117c, a second upper part 127a, and a second lower part 127c in the second direction DR2 increases along the third direction DR3 and then decreases. The other configuration is substantially the same or similar to that of the display device 1 as shown in FIG. 7. For example, a shape of each of the first upper part 117a, the first lower part 117c, the second upper part 127a, and the second lower part 127c may have a shape similar to a circle, but embodiments are not limited thereto.

In some embodiments, shapes of a first side wiring 117 and a second side wiring 127 may be the same as each other, but embodiments are not limited thereto. Hereinafter, for convenience of explanation, a description will focus on the shape of the first side wiring 117 and a description of the shape of the second side wiring 127 will be omitted for descriptive convenience.

In the first upper part 117a of the first side wiring 117, a width of a first_second upper part 117a_2 in the second direction DR2 may be greater than a width of a first connecting part 117b in the second direction DR2. For example, the width of the first_second upper part 117a_2 in the second direction DR2 may have the smallest value at a boundary with the first connecting part 117b and may gradually increase as being closer to one side in the third direction DR3. In some embodiments, as the maximum width of the first_second upper part 117a_2 of the first side wiring 117 in the second direction DR2, a width W7a of the first_second upper part 117a_2 covering a first_first edge DL_1a in the second direction DR2 may be greater than a width W7b of the first connecting part 110b in the second direction DR2, and as the minimum width of the first_second upper part 117a_2 in the second direction DR2, a width of a portion in contact with the first connecting part 117b in the second direction DR2 may be substantially equal to the width W7b of the first connecting part 117b in the second direction DR2. However, embodiments are not limited thereto.

For example, a width of a first_first upper part 117a_1 in the second direction DR2 may be smaller than the width of the first connecting part 117b in the second direction DR2 according to the position. For example, the width of the first_first upper part 117a_1 in the second direction DR2 may gradually decrease as being closer to one side in the third direction DR3. Accordingly, the width W7a of the first_first edge DL_1a covered by the first_second upper part 117a_2 in the second direction DR2 and a width of a first_second edge DL_1b covered by the first_second upper part 117a_2 in the second direction DR2 are greater than the width W7b of the first connecting part 117b in the second direction DR2. Therefore, a disconnection of the first side wiring 117 may be prevented, as well as the width of the first_first upper part 117a_1 in the second direction DR2 which is relatively less likely to be disconnected may be reduced, so that the amount of material necessary for forming the first side wiring 117 may be reduced.

In the first lower part 117c of the first side wiring 117, a width of a first_second lower part 117c_2 in the second direction DR2 may be greater than the width of the first connecting part 117b in the second direction DR2. For example, the width of the first_second lower part 117c_2 in the second direction DR2 may have the smallest value at a boundary with the first connecting part 117b and may gradually increase as being closer to the other side in the third direction DR3. In some embodiments, as the maximum width of the first_second lower part 117c_2 of the first side wiring 117 in the second direction DR2, a width W7c of the first_second lower part 117c_2 covering a second_first edge DL_2a in the second direction DR2 may be greater than the width W7b of the first connecting part 110b in the second direction DR2, and as the minimum width of the first_second lower part 117c_2 in the second direction DR2, a width of a portion in contact with the first connecting part 117b in the second direction DR2 may be substantially equal to the width W7b of the first connecting part 117b in the second direction DR2. However, embodiments are not limited thereto.

For example, a width of a first_first lower part 117c_1 in the second direction DR2 may be smaller than the width of the first connecting part 117b in the second direction DR2 according to the position. For example, the width of the first_first lower part 117c_1 in the second direction DR2 may gradually decrease as being closer to the other side in the third direction DR3. Accordingly, the width W7c of the second_first edge DL_2a covered by the first_second lower part 117c_2 in the second direction DR2 and a width of a second_second edge DL_2b covered by the first_second lower part 117c_2 in the second direction DR2 are greater than the width W7b of the first connecting part 117b in the second direction DR2. Therefore, a disconnection of the first side wiring 117 may be prevented, as well as the width of the first_first lower part 117c_1 in the second direction DR2 which is relatively less likely to be disconnected may be reduced, so that the amount of material necessary for forming the first side wiring 117 may be reduced.

With the configuration as described above, the side wirings of the display device 1_7 according to an embodiment can prevent disconnection and reduce the amount of material necessary for forming the side wirings.

Figure 16:
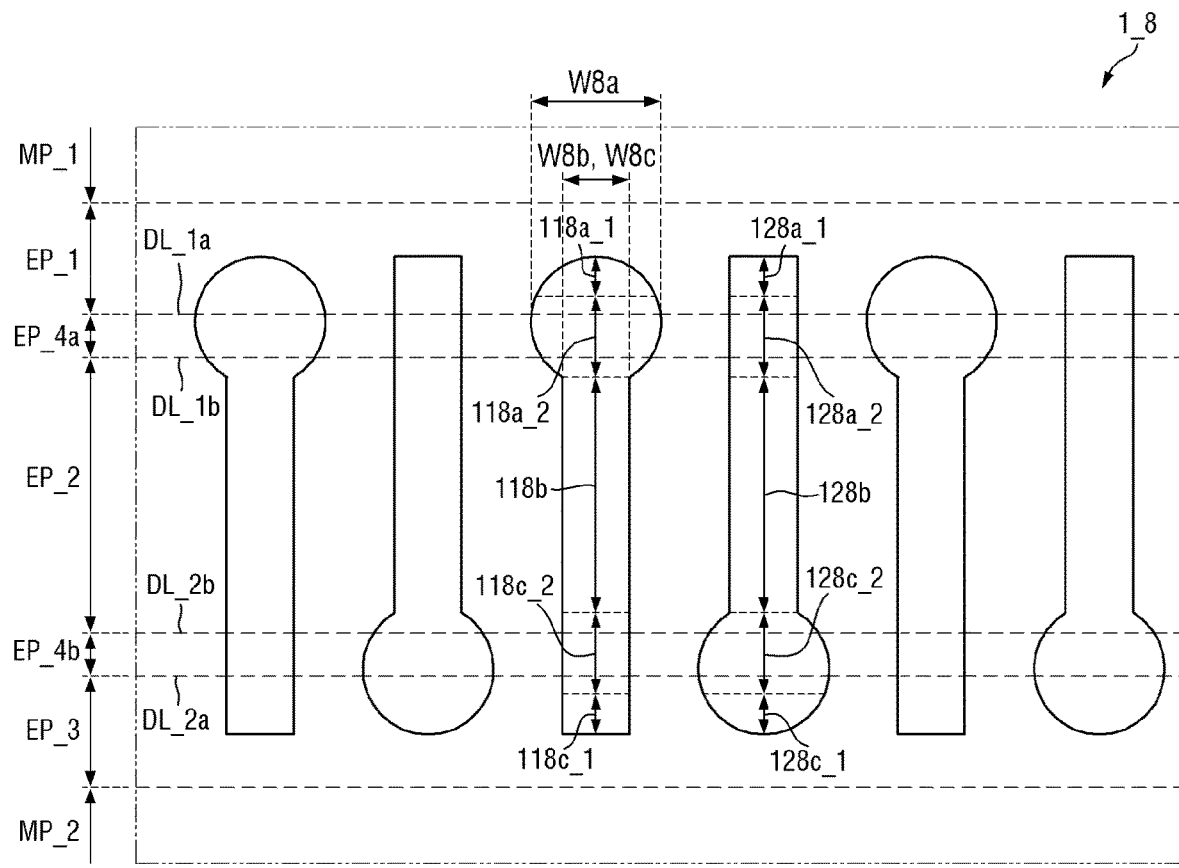
FIG. 16 is a schematic exploded view illustrating a first surface and a second surface of a main body portion of a substrate of a display device according to an embodiment.

FIG. 16 is a schematic exploded view illustrating a first surface and a second surface of a main body portion of a substrate of a display device according to an embodiment.

A display device 1_8 according to an embodiment is different from the display device 1_1 as shown in FIG. 9 in that a width of each of a first upper part 118a of a first side wiring 118 and a second lower part 128c of a second side wiring 128 in the second direction DR2 gradually increases along the third direction DR3 and then decreases. The other configuration is substantially the same or similar to that of the display device 1_1 as shown in FIG. 9. For example, the first upper part 118a according to an embodiment may have substantially the same shape as that of the first upper part 117a as shown in FIG. 15, and the second lower part 118c according to an embodiment may have substantially the same shape as that of the first lower part 117c as shown in FIG. 15.

The display device 1_8 according to an embodiment has the same shapes of the side wirings as those of the display device 1_7 as shown in FIG. 15, so that disconnection may be prevented, as well as the amount of material necessary for forming the side wirings may be reduced.

Figure 17:
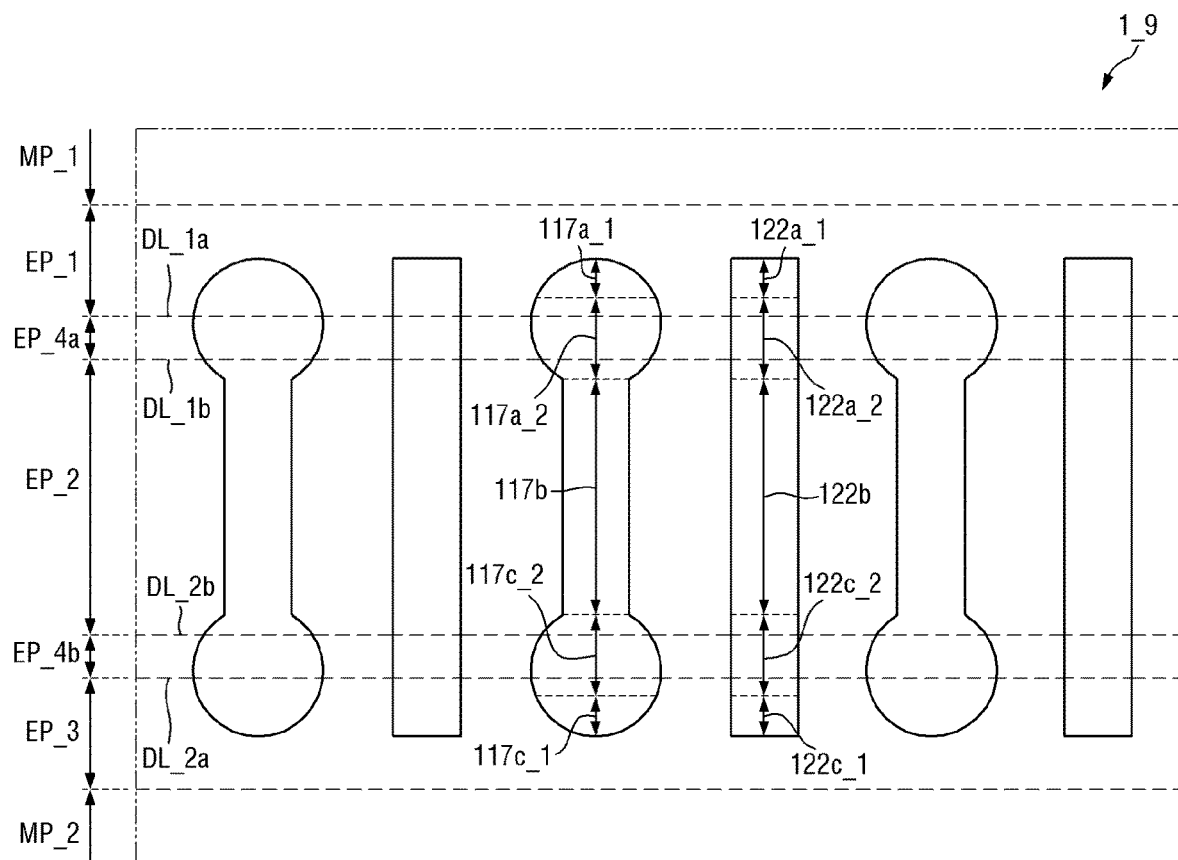
FIG. 17 is a schematic exploded view illustrating a first surface and a second surface of a main body portion of a substrate of a display device according to an embodiment.

FIG. 17 is a schematic exploded view illustrating a first surface and a second surface of a main body portion of a substrate of a display device according to an embodiment.

A display device 1_9 according to an embodiment is different from the display device 1_2 as shown in FIG. 10 in that a width of each of a first upper part 117a and a first lower part 117c of a first side wiring 117 in the second direction DR2 gradually increases along the third direction DR3 and then decreases. The other configuration is substantially the same or similar to that of the display device 1_2 as shown in FIG. 10. For example, the first side wiring 117 according to an embodiment may have substantially the same shape as that of the first side wiring 117 as shown in FIG. 15, and a second side wiring 122 according to an embodiment may have substantially the same shape as that of the second side wiring 112 as shown in FIG. 10.

The display device 1_9 according to an embodiment may prevent disconnection as well as reduce the amount of material necessary for forming the side wirings as described for the display device 1_7 shown in FIG. 15.

Figure 18:
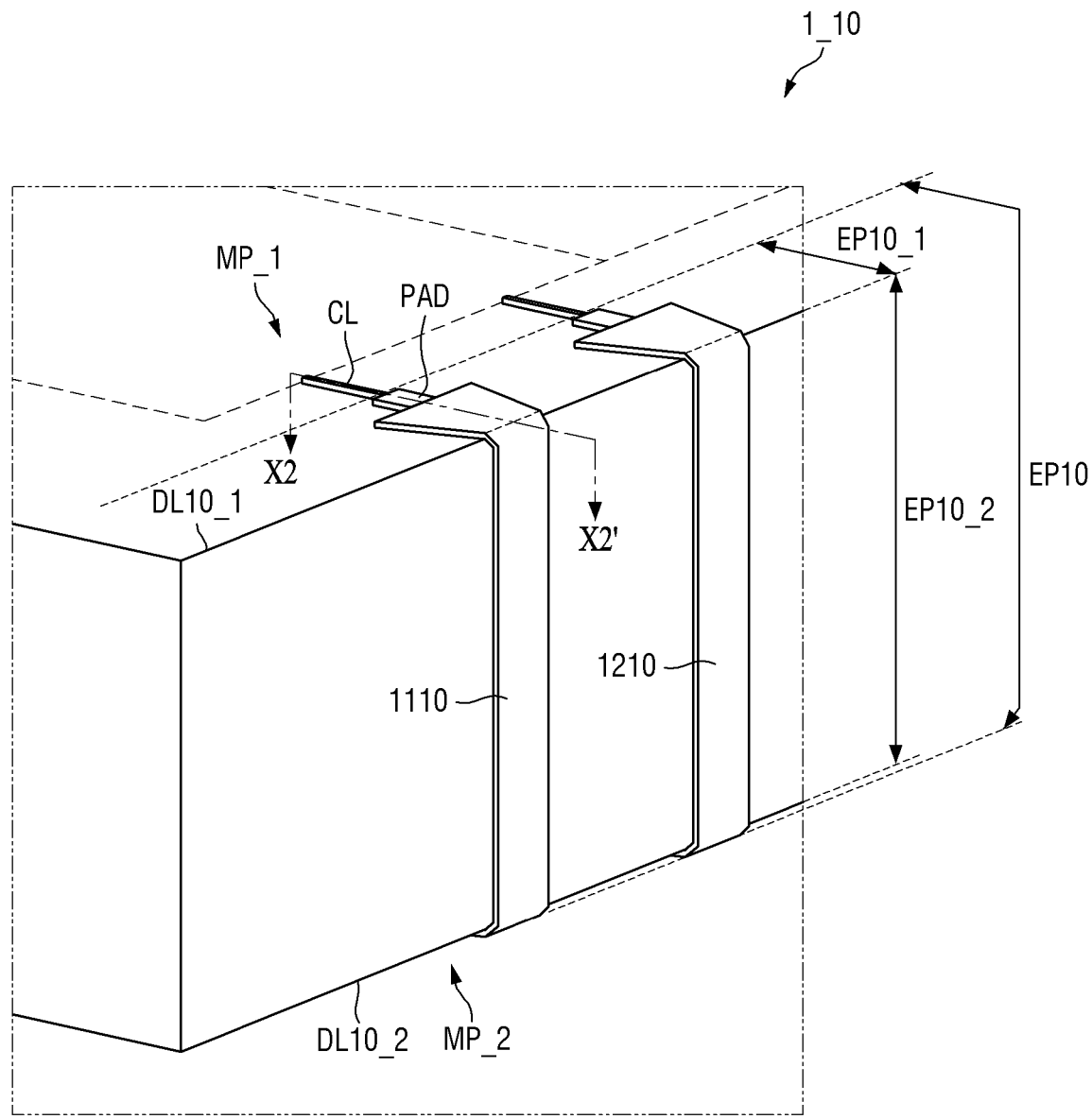
FIG. 18 is a schematic perspective view illustrating shapes of side wirings disposed on a substrate edge portion of a display device according to an embodiment.
Figure 19:
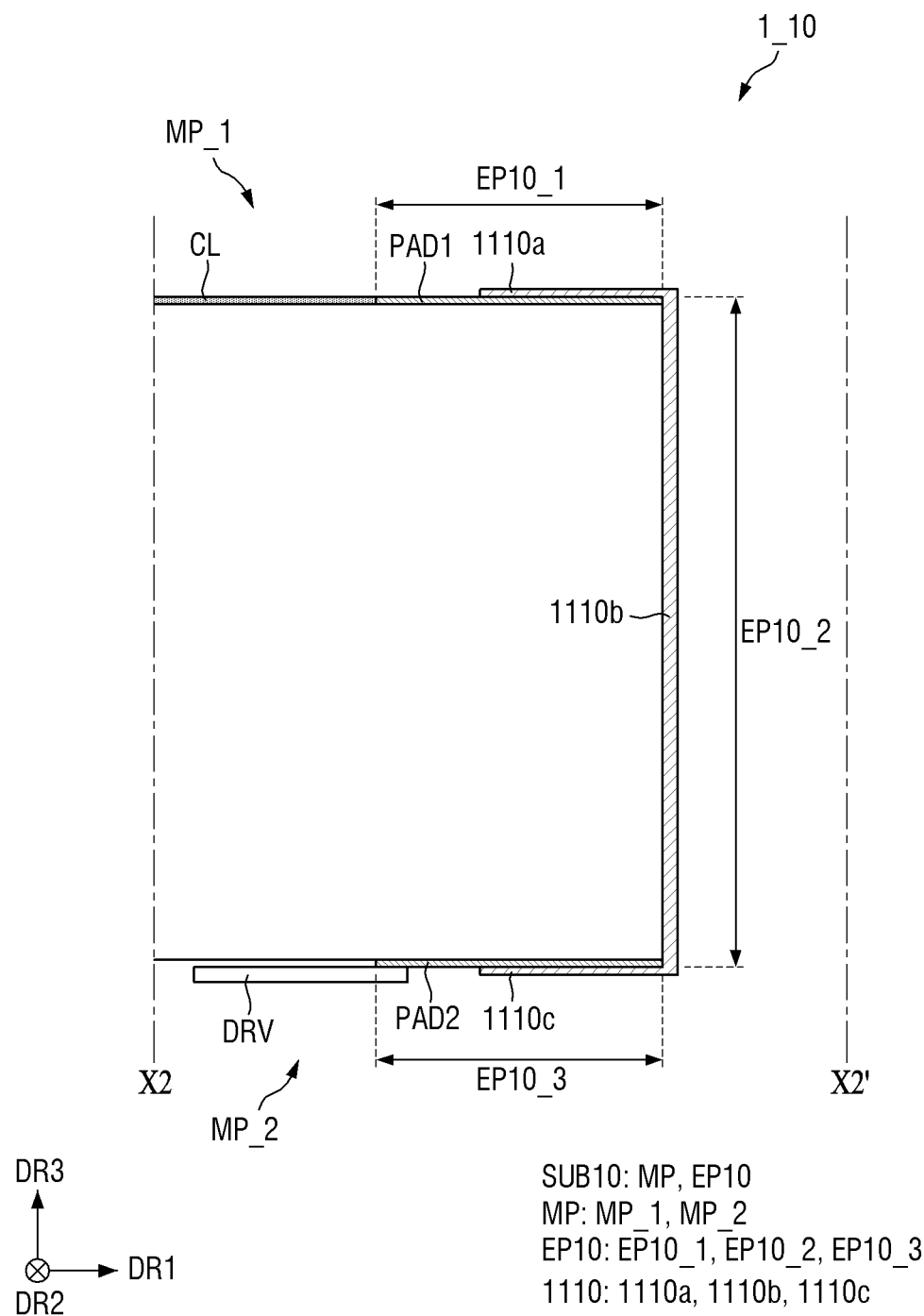
FIG. 19 is a schematic cross-sectional view taken along line X2-X2' of FIG. 18.
Figure 20:
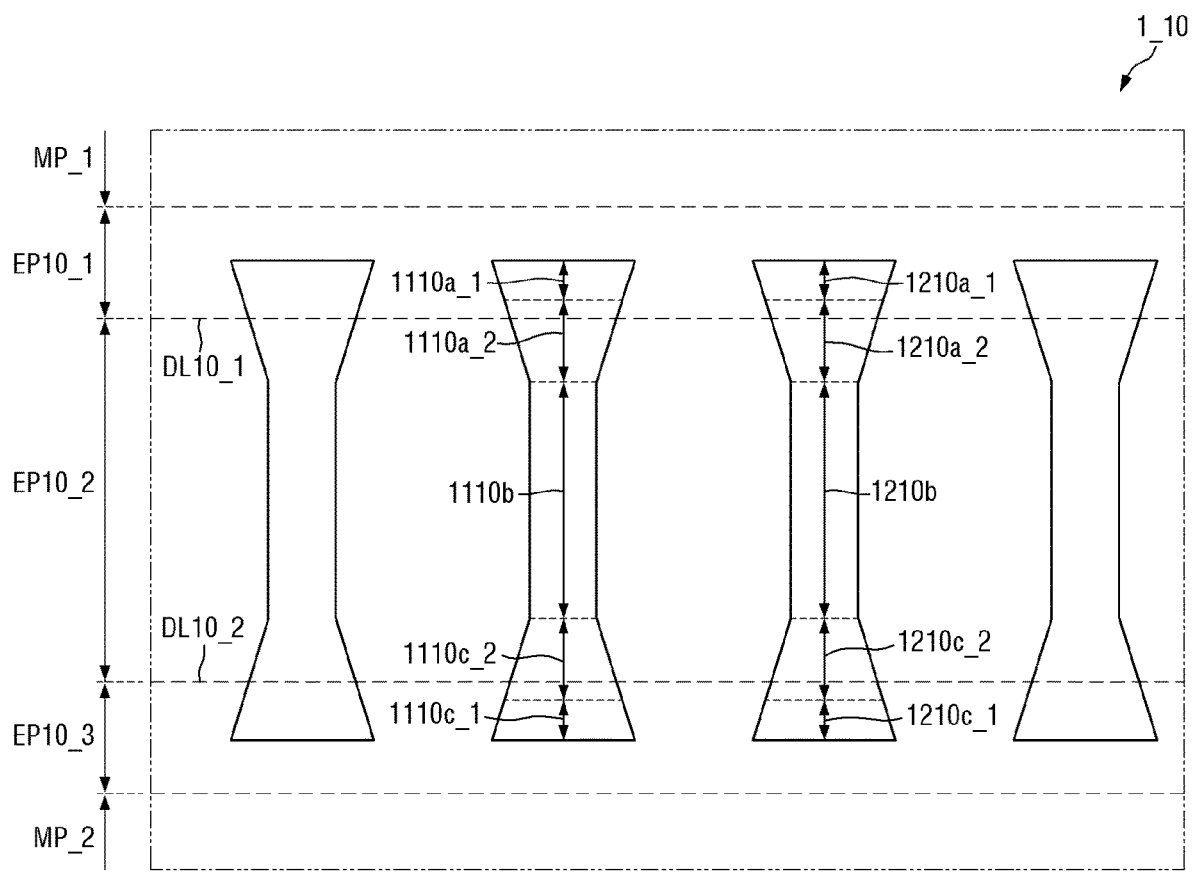
FIG. 20 is a schematic exploded plan view illustrating a first surface and a second surface of a main body portion of a substrate of the display device of FIG. 18 according to an embodiment.

FIG. 18 is a schematic perspective view illustrating shapes of side wirings disposed on a substrate edge portion of a display device according to an embodiment. FIG. 19 is a schematic cross-sectional view taken along line X2-X2' of FIG. 18. FIG. 20 is a schematic exploded plan view illustrating a first surface and a second surface of a main body portion of a substrate of the display device of FIG. 18 according to an embodiment.

Referring to FIGS. 18 to 20, a display device 1_10 according to an embodiment may have an edge portion EP10 that is not chamfered. For example, the edge portion EP10 according to an embodiment may have a structure in which the first chamfered surface EP_4a and the second chamfered surface EP_4b of the edge portion EP of FIG. 7 are omitted, and a substrate SUB10 may have a rectangular shape. Accordingly, the fabrication of the substrate SUB10 may be facilitated.

An upper surface of the substrate SUB10 according to an embodiment may be defined as a first surface MP_1 of a main body portion MP and a first flat surface EP10_1 of the edge portion 10 and a lower part may be defined as a second surface MP_2 of the main body portion MP and a third flat surface EP10_3 of the edge portion EP10. A side surface may be defined as a second flat surface EP10_2 of the edge portion EP10.

In some embodiments, a shape of a first side wiring 1110 and a shape of a second side wiring 1210 may be substantially the same as each other, but embodiments are not limited thereto. For example, a first upper part 1110a of the first side wiring 1110 may correspond to a second upper part 1210a of the second side wiring 1210, and a first connecting part 1110b may correspond to a second connecting part 1210b. A first lower part 1110c may correspond to a second lower part 1210c. Hereinafter, for convenience of explanation, a description will be given focusing on an example in which the shape of the first side wiring 1110 and the shape of the second side wiring 1210 are the same to each other, and a detailed description of the shape of the second side wiring 1210 will be omitted for descriptive convenience.

In the first upper part 1110a of the first side wiring 1110 according to an embodiment, a first_second upper part 1110a_2 may cover a first edge DL10_1 formed as a boundary between the first flat surface EP10_1 and the second flat surface EP10_2. A first_second lower part 1110c_2 of the first lower part 1110c may cover a second edge DL10_2 formed as a boundary between the second flat surface EP10_2 and the third flat surface EP10_3. For example, the first_second upper part 1110*a*_2 may cover a portion of the first flat surface EP10_1 and a portion of the second flat surface EP10_2, and the first_second lower part 1110*c*_2 may cover a portion of the second flat surface EP10_2 and a portion of the third flat surface EP_3.

With the configuration as described above, the display device 1_10 according to an embodiment may facilitate the fabrication of a substrate, as well as prevent disconnection of the side wirings.

According to embodiments, a display device may prevent disconnection of side wirings.

However, the effects of the embodiments are not restricted to the one set forth herein. The above and other effects of the embodiments will become more apparent to one of daily skill in the art to which the embodiments pertain by referencing the claims.

In concluding the detailed description, those skilled in the art will appreciate that many variations and modifications can be made to the embodiments without substantially departing from the principles of an invention. Therefore, the embodiments are used in a generic and descriptive sense only and not for purposes of limitation.

What is claimed is:

1. A display device comprising:
   a substrate comprising:
      a first surface;
      a second surface facing the first surface; and
      a side surface connecting the first surface and the second surface;
   a first side wiring disposed on the side surface of the substrate and extending in a first direction from the first surface to the second surface, wherein
   the first side wiring comprises:
      a first upper part adjacent to the first surface;
      a first lower part adjacent to the second surface; and
      a first connecting part connecting between the first upper part and the first lower part, and
   at least one of the first upper part and the first lower part includes a portion covering the side surface as seen from a viewpoint orthogonal to the side surface and parallel to the first surface that has a width greater than a width of the first connecting part.

2. The display device of claim 1, wherein
   the width of the first upper part and the width of the first lower part are greater than the width of the first connecting part, and
   the first upper part, the first lower part, and the first connecting part are integrally formed with each other.

3. The display device of claim 2, wherein
   the first upper part covers a boundary between the first surface and the side surface of the substrate, and
   the first lower part covers a boundary between the second surface and the side surface of the substrate.

4. The display device of claim 3, further comprising:
   a second side wiring extending in the first direction and disposed to be spaced apart from the first side wiring in a second direction intersecting the first direction, wherein
   the second side wiring comprises:
      a second upper part adjacent to the first surface;
      a second lower part adjacent to the second surface; and
      a second connecting part connecting between the second upper part and the second lower part,
   a width of the second upper part and a width of the second lower part are greater than a width of the second connecting part, and
   the first side wiring and the second side wiring are repeatedly disposed in the second direction.

5. The display device of claim 4, wherein
   the second upper part covers the boundary between the first surface and the side surface of the substrate, and
   the second lower part covers the boundary between the second surface and the side surface of the substrate.

6. The display device of claim 5, wherein
   the width of the first upper part of the first side wiring gradually increases as being closer to the first surface,
   a width of a portion of the first upper part in contact with the first connecting part and the width of the first connecting part are substantially same as each other,
   the width of the second upper part of the second side wiring gradually increases as being closer to the first surface, and
   a width of a portion of the second upper part in contact with the second connecting part and the width of the second connecting part are substantially same as each other.

7. The display device of claim 5, wherein
   a width of a portion of the first upper part in contact with the first connecting part is greater than the width of the first connecting part, and
   a width of the second upper part in contact with the second connecting part is greater than the width of the second connecting part.

8. The display device of claim 5, wherein
   the width of the first upper part of the first side wiring gradually increases as being closer to the first surface, and
   the width of the second upper part of the second side wiring gradually decreases as being closer to the first direction.

9. The display device of claim 5, further comprising:
   a plurality of pixels disposed on the first surface of the substrate; and
   a driving portion disposed on the second surface of the substrate,
   wherein the first side wiring and the second side wiring electrically connect the plurality of pixels and the driving portion.

10. The display device of claim 1, wherein the first upper part of the first side wiring has a width greater than the width of the first lower part and the width of the first connecting part.

11. The display device of claim 10, further comprising a second side wiring extending in the first direction and disposed to be spaced apart from the first side wiring in a second direction intersecting the first direction, wherein
    the second side wiring comprises:
       a second upper part adjacent to the first surface;
       a second lower part adjacent to the second surface; and
       a second connecting part connecting between the second upper part and the second lower part,
    the second lower part has a width greater than a width of the second upper part and a width of the second connecting part, and
    the first side wiring and the second side wiring are repeatedly disposed in the second direction.

12. The display device of claim 11, wherein
    the width of the first connecting part and the width of the first lower part are substantially same as each other, and
    the width of the second connecting part and the width of the second lower part are substantially same as each other.

13. The display device of claim 1, further comprising a second side wiring extending in the first direction and disposed to be spaced apart from the first side wiring in a second direction intersecting the first direction, wherein
the second side wiring has a width that is substantially constant along the first direction, and
the first side wiring and the second side wiring are repeatedly disposed in the second direction.

14. A display device comprising:
a substrate comprising:
a main body portion comprising a first surface and a second surface facing the first surface, and
an edge portion connecting the first surface and the second surface of the main body portion; and
a plurality of side wirings disposed on the edge portion and spaced apart from each other, wherein
the edge portion of the substrate comprises:
a first flat surface in contact with the first surface and parallel to the first surface;
a first chamfered surface inclined with respect to the first flat surface and in contact with the first flat surface; and
a second flat surface inclined with respect to the first chamfered surface and in contact with the first chamfered surface,
each of the plurality of side wirings comprises:
an upper part adjacent to the first surface;
a lower part adjacent to the second surface; and
a connecting part connecting the upper part and the lower part and having a width smaller than a width of the upper part, and
the upper part of each of the plurality of side wirings covers the first flat surface, the first chamfered surface, and the second flat surface.

15. The display device of claim 14, wherein
the first flat surface and the first chamfered surface of the edge portion are in contact with each other to form a first first edge as a boundary between the first flat surface and the first chamfered surface,
the first chamfered surface and the second flat surface are in contact with each other to form a first second edge as a boundary between the first chamfered surface and the second flat surface, and
the upper part covers the first first edge and the first second edge.

16. The display device of claim 15, wherein
the edge portion further comprises:
a third flat surface in contact with the second surface and parallel to the second surface; and
a second chamfered surface inclined with respect to the third flat surface and in contact with the third flat surface and the second flat surface, and
the lower part has a width greater than a width of the connecting part and covers the second flat surface, the second chamfered surface, and the third flat surface.

17. The display device of claim 16, further comprising:
a plurality of pixels disposed on the first surface of the main body portion;
a driving portion disposed on the second surface of the main body portion; and
a plurality of pads disposed on the first flat surface and the third flat surface,
wherein the plurality of pads electrically connect the plurality of pixels and the plurality of side wirings on the first flat surface and electrically connect the plurality of side wirings and the driving portion on the third flat surface.

18. A display device comprising:
a substrate comprising:
a first surface,
a second surface facing the first surface, and
a side surface connecting the first surface and the second surface; and
a first side wiring and a second side wiring disposed on the side surface of the substrate, extending in a first direction from the first surface to the second surface, and spaced apart from each other in a second direction intersecting the first direction, wherein
the first side wiring comprises:
a first upper part adjacent to the first surface,
a first lower part adjacent to the second surface, and
a first connecting part connecting between the first upper part and the first lower part,
the second side wiring comprises:
a second upper part adjacent to the first surface,
a second lower part adjacent to the second surface, and
a second connecting part connecting between the second upper part and the second lower part, and
a distance between a first portion of the first upper part and a second portion of the second upper part in the second direction is smaller than a distance between the first connecting part and the second connecting part in the second direction as seen from a viewpoint orthogonal to the side surface and parallel to the first surface, the first portion and the second portion covering the side surface as seen from a viewpoint orthogonal to the side surface and parallel to the first surface.

19. The display device of claim 18, wherein
the first upper part, the first lower part, and the first connecting part are integrally formed with each other,
the second upper part, the second lower part, and the second connecting part are integrally formed with each other, and
a distance between the first lower part and the second lower part in the second direction is smaller than the distance between the first connecting part and the second connecting part in the second direction.

20. The display device of claim 18, wherein
a width of the first upper part gradually decreases as being closer to the first connecting part,
a width of the second upper part gradually increases as being closer to the second connecting part, and
the distance between the first upper part and the second upper part is substantially constant along the first direction.

* * * * *